(12) United States Patent
Harmon

(10) Patent No.: US 9,076,707 B2
(45) Date of Patent: Jul. 7, 2015

(54) INTEGRATED AVALANCHE PHOTODIODE ARRAYS

(71) Applicant: LightSpin Technologies, Inc., Endicott, NY (US)

(72) Inventor: Eric S. Harmon, Norfolk, MA (US)

(73) Assignee: LightSpin Technologies, Inc., Endicott, NY (US)

( * ) Notice: Subject to any disclaimer, the term of this patent is extended or adjusted under 35 U.S.C. 154(b) by 0 days.

(21) Appl. No.: 14/257,179

(22) Filed: Apr. 21, 2014

(65) Prior Publication Data

US 2014/0312448 A1 Oct. 23, 2014

Related U.S. Application Data

(60) Provisional application No. 61/813,720, filed on Apr. 19, 2013.

(51) Int. Cl.
*H01L 27/146* (2006.01)
*H01L 31/107* (2006.01)
*H01L 27/144* (2006.01)

(52) U.S. Cl.
CPC ........ *H01L 27/14643* (2013.01); *H01L 31/107* (2013.01); *H01L 27/14683* (2013.01); *H01L 27/1446* (2013.01)

(58) Field of Classification Search
CPC ............ H01L 27/14643; H01L 31/107; H01L 27/14683; H01L 27/1446
See application file for complete search history.

(56) References Cited

U.S. PATENT DOCUMENTS

| 5,866,936 A | 2/1999 | Hasnain et al. |
| 2011/0024768 A1 | 2/2011 | Veliadis |
| 2013/0022077 A1 | 1/2013 | Harmon et al. |

OTHER PUBLICATIONS

ISA/US, "International Search Report for App. No. PCT/US14/34762", Aug. 22, 2014, WIPO.

*Primary Examiner* — Long Pham
(74) *Attorney, Agent, or Firm* — Intrinsic Law Corp.; Ibrahim M. Hallaj

(57) ABSTRACT

The present disclosure includes devices for detecting photons, including avalanche photon detectors, arrays of such detectors, and circuits including such arrays. In some aspects, the detectors and arrays include a virtual beveled edge mesa structure surrounded by resistive material damaged by ion implantation and having side wall profiles that taper inwardly towards the top of the mesa structures, or towards the direction from which the ion implantation occurred. Other aspects are directed to masking and multiple implantation and/or annealing steps. Furthermore, methods for fabricating and using such devices, circuits and arrays are disclosed.

10 Claims, 29 Drawing Sheets

INTEGRATED AVALANCHE PHOTODIODE ARRAYS

RELATED APPLICATIONS

This application is related to and claims the benefit and priority of U.S. Provisional Application No. 61/813,720 entitled, "Integrated SPAD Array," filed on Apr. 19, 2013, which is hereby incorporated by reference.

GOVERNMENT SUPPORT

Aspects of the present benefited from US Government support under SBIR Phase I, Grant No. DE-SC0009538 awarded by the Department of Energy. The US Government may have certain rights in the invention(s) pursuant to 35 USC Section 202(c)(6), as applicable.

TECHNICAL FIELD

The present application is directed to photon detectors or photodetector devices. Particularly to photodetectors employing doped semiconductor materials that can be used as single photon avalanche detectors, including fabrication techniques to achieve improved results from the same.

BACKGROUND

Avalanche Photodiodes (APDs) are photodetectors that use avalanche multiplication to achieve internal gain. Many prior art sources describe photodetectors, such as J. C. Campbell, "Recent Advances in Telecommunications Avalanche Photodiodes," J. Lightwave Technology v. 25(1) Pp. 109-121 (2007), which are hereby incorporated by reference. Single photon avalanche photodiodes (SPADs) are a specific class of avalanche photodiodes that are capable of detecting single photons. Examples of SPADs are given for example in S. Cova, et al. "Evolution and prospects for single-photon avalanche diodes and quenching circuits," J. Modern Optics v. 51(9-10) Pp. 1267-1288 (2004), which is hereby incorporated by reference.

APD and SPAD arrays are also known in the art, and include a range of devices such as the silicon photomultiplier (SiPM), the multi-pixel photon detector (MPPC), and a number of similar devices. Reference is made to the digital SiPM (dSiPM) approach disclosed in US Pub. Nos. 2011/0079727, 2010/0127314, and T. Frach et al. "The Digital Silicon Photomultiplier—System Architecture and Performance Evaluation," 2010 IEEE Nuclear Science Symposium Conference Record (NSS/MIC), Pp. 1722-1727 (2010), which are hereby incorporated by reference. Other examples of prior devices are described in International Workshop on New Photon-detectors 2012, LAL Orsay, France, and the presentation entitled "The SiPM Physics and Technology—a Review—," G. Collazuol, found online at the time of this submission at http://indico.cern.ch/getFile.py/access?contribId=72&resId=0&materialId=slides&confId=164917; W-S Sul et al. "Guard Ring Structures for Silicon Photomultipliers," IEEE Electron; Dev., Lett, v.31(1) Pp 41-43 (2010); A. G. Stewart et al. "Performance of 1-mm2 Silicon Photomultiplier," IEEE J. Quantum Electronics Vol. 44(2) pp. 157-164, (2008), all of which are hereby incorporated by reference. A simple SPAD array devices incorporates a single photon avalanche diode (SPAD) and a passive quench circuit. The passive quench circuit consists of a current limiting element (usually a resistor) in parallel with a bypass capacitor as described in S. Tiza et al. "Electronics for single photon avalanche diode arrays," Sensors and Actuators A 140, Pp. 113-122 (2007) and S. Seifert et al. "Simulation of Silicon Photomultiplier Signals," IEEE Trans. Nuclear Science, v. 56(6) Pp. 3726-3733 (December 2009). All of the above references are incorporated herein by references.

Prior art APD arrays have also used various techniques for isolating adjacent APD elements. For example PN junction isolation and mesa isolation are well known in the prior art. PN junction isolation is generally achieved by confining the lateral extent of doping to separate p-type regions (on an n-type substrate) or n-type regions (on a p-type substrate) or both. Edge effects in isolated devices often results in electrical field crowding along the perimeter of the APD device, which would normally cause a non-uniform avalanche gain profile. Edge effects in isolated devices are mitigated through the use of double-diffused structures, guard ring structures, or other approaches well known in the state of the art (see, for example, Y. Liu, S. R. Forrest, J. Hladky, M. J. Lange, G. H. Olsen, and D. E. Ackley, "A Planar InP/InGaAs Avalanche Photodiode with Floating Guard Ring and Double Diffused Junction," J. Lightwave Technology, v. 10(2) February 2991, and Chapter 3: Breakdown Voltage in Power Semiconductor Devices, Pp. 67-127 by B. J. Baliga, PWS Publishing Company, Boston, Mass. 1996).

Mesa isolation can be used to define the active area of a APD and to laterally isolate adjacent APD elements, by partially or fully removing the conductive pathway between adjacent APD elements. The use of a beveled edge structure in mesa isolation can be used to mitigate edge effects, but places stringent demands on the mesa structure (bevel angle) and surface state density of the mesa. Beveled edge mesa structures are described in detail by B. J. Baliga "Power Semiconductor Devices," Pp. 103-111, PWS Publishing Company, Boston, Mass., which is hereby incorporated by reference.

Ion implantation isolation is used to render a semiconductor region insulating, semi-insulating, or very low conductivity. Ion implantation isolation is often used with respect to compound semiconductor devices where ion implantation creates a sufficient amount of deep levels in a semiconductor region to compensate some the doping in said semiconductor region, thereby reducing conductivity and often rendering the region highly resistive. For all cases of ion implantation isolation, a residual conductivity remains, with experimental values exceeding 1E9 ohms/square, though somewhat lower values of resistivity are common. The residual conductivity is often attributed to residual free carrier conductivity and/or hopping conduction. For compound semiconductors such as GaAs, AlGaAs, GaInP, InGaAsP, and InAlInN, implant isolation is often achieved by using hydrogen ions, helium ions, oxygen ions, nitrogen ions, boron ions, fluorine ions, arsenic ions, and phosphorous ions, through those skilled in the art will recognize that any suitable ion may be used. The residual conductivity is a function of the implant species, implant energy, implant dose, and implant profile. While conventional ion implantation for doping generally achieves (at most) 1 free carrier for each dopant atom, ion implantation isolation achieves a multiplier effect whereby implantation of a single atom (or species) can produce a 10-fold or higher reduction in the free carrier concentration. This occurs because the lattice damage induced by the implanted ion produces the compensating donors/acceptors, and not the specific ion itself. In some cases, the specific ion may also be used as a compensating level, such as through the use of arsenic implantation in GaAs. Ion implant isolation is well known in the literature, as illustrated by one or more of the following references: Q. Zhou, et al. "Proton-Implantation-Isolated 4H—SiC Avalanche Photodiodes," IEEE Photonics Technology Lett. v.

21(23) Pp. 1734-1736 (2009); I. Sandall, et al. "Planar InAs photodiodes fabricated using He ion implantation," Optics Express v.20(8) Pp. 8575-8583 (2012); Q. Zhou, et al. "Proton-Implantation-Isolated Separate Absorption Charge and Multiplication 4H—SiC Avalanche Photodiodes," IEEE Photonics Technology Letters v. 23(5) Pp. 299-301 (2011); G. E. Bulman, et al. "Proton isolated In0.2Ga0.8As/GaAs strained layer superlattice avalanche photodiode," Appl. Phys. Lett. v.48, Pp. 1015-1017 (1986); I. Danilov, et al. "Electrical isolation of InGaP by proton and helium ion irradiation," J. Appl. Phys., v. 92 Pp. 4261-4265 (2002); S. J. Pearton, "Ion Implantation for Isolation of III-V Semiconductors," Materials science reports, v. 4(8), (1990); Vasteras Willy Hermansson, et al. in U.S. Pat. No. 5,914,499, entitled "High Voltage Silicon Carbide Semiconductor device with bended edge" (1999); Tzu-Yu Wang, U.S. Pub. No. 2005/0078725, entitled "Methods for Angled Ion Implantation of Semiconductor Devices, (2005); and D. B. Slater, et al., U.S. Pat. No. 7,943, 406 "LED Fabrication via ion implant isolation" (2011).

A physical beveled edge mesa structure can be fabricated on a photodetector as illustrated in FIG. 1. Semiconductor layers 101 and 102 are formed on a semiconductor substrate 100 using techniques known in the art. Layer 101 is an n-type semiconductor layer with a thickness 111. Layer 102 is a p-type semiconductor layer with a thickness 112. The doping density of n-type semiconductor layer 101 is higher than the doping density of p-type semiconductor layer 102, such that the thickness or width 133 of the depletion region on the p-type side of the junction is larger than the thickness or width 134 of the depletion region on the n-type side of the junction. The dashed line 122 represents the edge of the depletion region in the p-type side of the device, while dashed line 121 represents the edge of the depletion region on the n-type side of the device.

With the appropriate choices for the doping densities in layers 101 and 102, and the bevel angle 131, the total depletion layer thickness 132 in the center portion of the device can be made smaller than the total depletion layer thickness 135 at the perimeter of the device, with the net result that the electric field in the center of the device is larger than the electric field along the perimeter of the device, which therefore allows the device performance to be dominated by the bulk properties of the semiconductor in the center of the device, and reduces the dependence of the device performance on the perimeter.

A challenge remains to fabricate effective avalanche photodetector devices, which have favorable performance and scalability yet have favorable dimensional and manufacturing characteristics. This disclosure addresses and remedies these and other failings of the prior art physical mesa photodetectors and similar devices.

SUMMARY

Aspects of the present disclosure are directed to isolating APD pixels in an array through the use of ion implantation isolation. Other aspects are directed to producing a virtual beveled edge geometry to effectively reduce electrical field peaking near the perimeter of the APD. Yet other aspects are directed to forming a passive quench resistor through the use of ion implantation isolation to form a highly resistive layer. Still other aspects are directed to forming a bypass capacitor through the use of ion implantation isolation to form the insulator of a capacitor structure, including a tri-layer structure having an insulating central layer, e.g., a metal-insulator-semiconductor (MIS), metal-insulator-metal (MIM), or semiconductor-insulator-semiconductor (SIS) structure. Still other aspects are directed to combining the quench resistor and bypass resistor through the use of a MIS, MIM, or SIS structures where the insulator can be considered to be a leaky insulator with a small residual conductivity suitable for achieving the required resistance for the passive quench circuit. The MIS, MIM, or SIS structure therefore can act as a critical component of the passive quench circuit, contributing some or all of the necessary resistance and capacitance. Other aspects are directed to combining the functions of isolating SPAD pixels, forming a passive quench resistor, and/or forming a bypass capacitor in any combination.

In addition to the resistor/capacitor passive quench circuit described above, alternative SPAD array designs may incorporate additional circuitry at the pixel level. For example, circuitry may be used to amplify the SPAD output signal to improve signal to noise, or to provide a pixel level threshold circuit to convert the SPAD output (generally in the range of 1 fC-1000 fC of charge) to a digital voltage level. This additional circuitry may also help to isolate the SPAD element from the parasitic load capacitance and resistance of the other devices in the array.

Limitations of the prior art include, non-planar APD device structures, including the inability to accurately control the mesa geometry, difficulty in passivating surface states on mesa side walls, instability of surface passivation on mesa side walls, and increased dark current. Additional limitations of the prior art include a reduction in the photosensitive area of devices and arrays of devices due to the area consumed to achieve the beveled angle mesa isolation.

Limitations of planar geometry APD prior art include difficulty in achieve desired laterally patterned doping properties, crystalline defects induced by diffusion or implant isolation, and inadequate suppression of the electric field near the perimeter of the device. Additional limitations of planar geometry prior art include the need for guard rings, and other edge termination approaches, and a consequent reduction in the photosensitive area of devices and arrays due to the area consumed by the guard ring or other edge termination approaches.

Further limitations of the prior art for SPAD devices with monolithically integrated quench circuitry includes difficulty in reliably producing the current limiting element of the passive quench circuit, devoting significant pixel real estate to the current limiting element of the passive quench circuit, a reduction in the photosensitivity due to the real estate consumed by the current limiting element of the passive quench circuit, and reducing the photosensitivity due to shadowing of the SPAD element by the current limiting element of the passive quench circuit. Additional limitations in the prior art include reducing the photosensitivity due to the real estate consumed by the bypass capacitor of the passive quench circuit and reducing the photosensitivity due to shadowing of the SPAD element by the bypass capacitor of the passive quench circuit.

Objects of the invention therefore include a means of isolating APD elements, including APD arrays and SPAD arrays, a means of mitigating perimeter/edge effects of APD elements, including a means of reducing electrical field peaking near the edge of a device, a means for reducing the dark current of said APD elements, a means of forming a current limiting element for the passive quench circuit of a SPAD pixel, a means of incorporating a bypass capacitor for the passive quench circuit of a SPAD pixel, or any combination of the above.

Some embodiments are therefore directed to a semiconductor device, comprising a substrate layer; a plurality of doped semiconductor layers including a first semiconductor layer doped with a first dopant disposed above said substrate and a second semiconductor layer doped with a second dopant disposed above said first semiconductor layer and proximal thereto; a first depletion region in said first semiconductor layer proximal to said second semiconductor layer; a second depletion region in said second semiconductor layer proximal to said first semiconductor layer; said first and second semiconductor layers being ion implanted in selected regions thereof and having an ion implantation profile in each of said first and second semiconductor layers at a generally positive lateral profile angle with respect to a normal to said first and second semiconductor layers; and said ion implantation profile further defining interior regions of said first and second semiconductor layers that are not ion implanted, and exterior regions of said first and second semiconductor layers that are ion implanted, said interior non-implanted region of the first semiconductor layer having a larger area than said interior non-implanted region of the second semiconductor layer.

Other embodiments are directed to a photo detector array, comprising a substrate layer; a plurality of doped semiconductor layers including a first semiconductor layer doped with a first dopant disposed above said substrate and a second semiconductor layer doped with a second dopant disposed above said first semiconductor layer and proximal thereto; said first and second semiconductor layers being ion implanted in a plurality of selected regions thereof at generally positive lateral profile angles with respect to a normal to said first and second semiconductor layers so as to form a corresponding plurality of mesa structures having angled side profiles in said first and second semiconductor layers; and a photon detection circuit including a plurality of ohmic connections to one or more of said mesa structures so as to provide at least one output signal of said array corresponding to one or more detected photon interactions within said mesa structures.

Still other embodiments are directed to a photo detector device, comprising a multi-layer semiconductor structure fabricated on a substrate; at least one photon detection region having virtual beveled edges formed by an ion implantation profile in said multi-layer semiconductor structure, said virtual beveled edges having a positive profile angle or slope with respect to a normal to said structure that defines a wider area of said photon detection region proximal to said substrate and a narrower area distal from said substrate; and a passive quench circuit having electrical connections to said structure, said quench circuit including a tri-layered structure having an insulating layer at its center, where the center insulating layer is electrically isolated on at least some sides thereof by an ion implant isolation region exhibiting a residual resistivity greater than that of adjacent regions.

IN THE DRAWINGS

For a fuller understanding of the nature and advantages of the present concepts, reference is made to the following detailed description of preferred embodiments and in connection with the accompanying drawings, in which.

Figure 6:
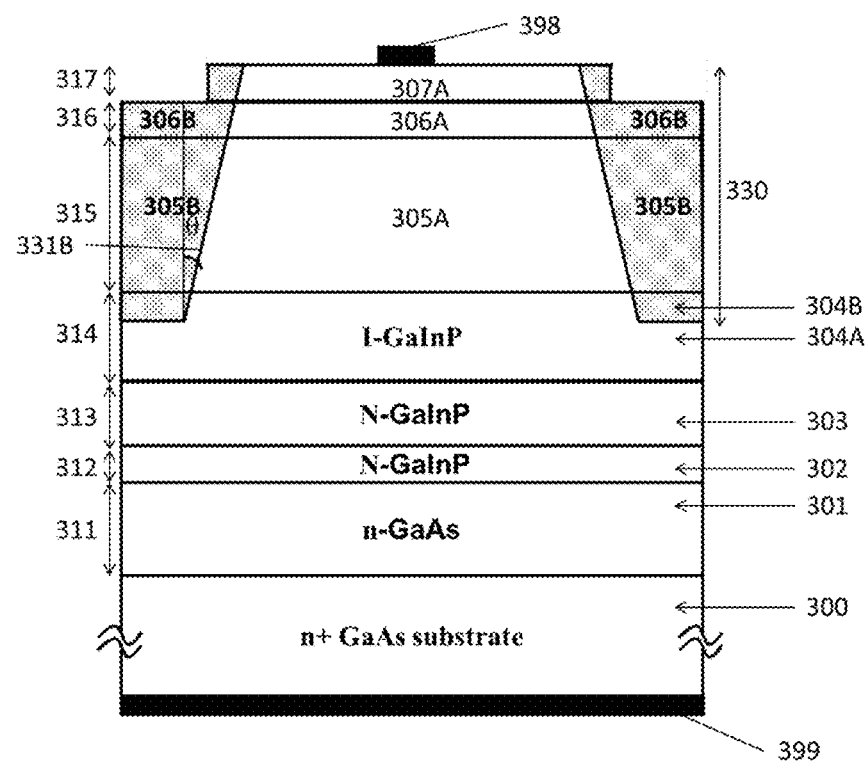
Figure 7:
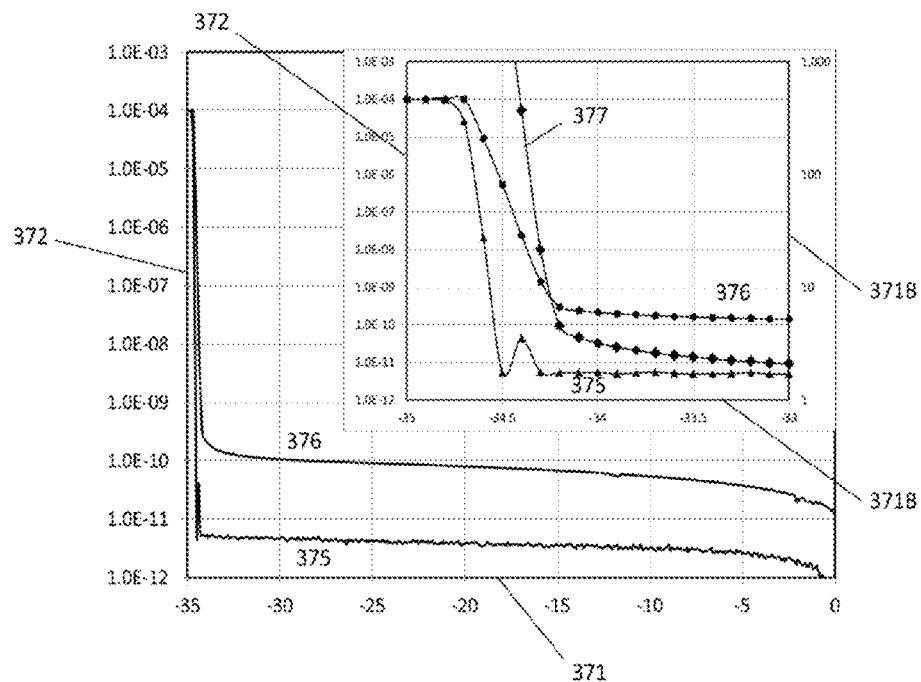
Figure 8:
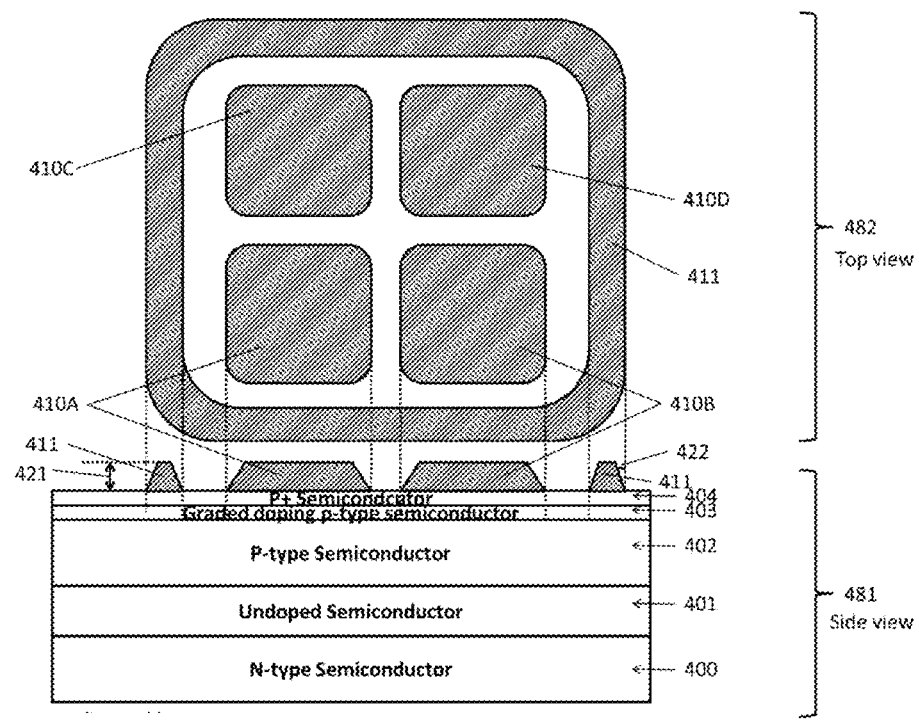
Figure 9:
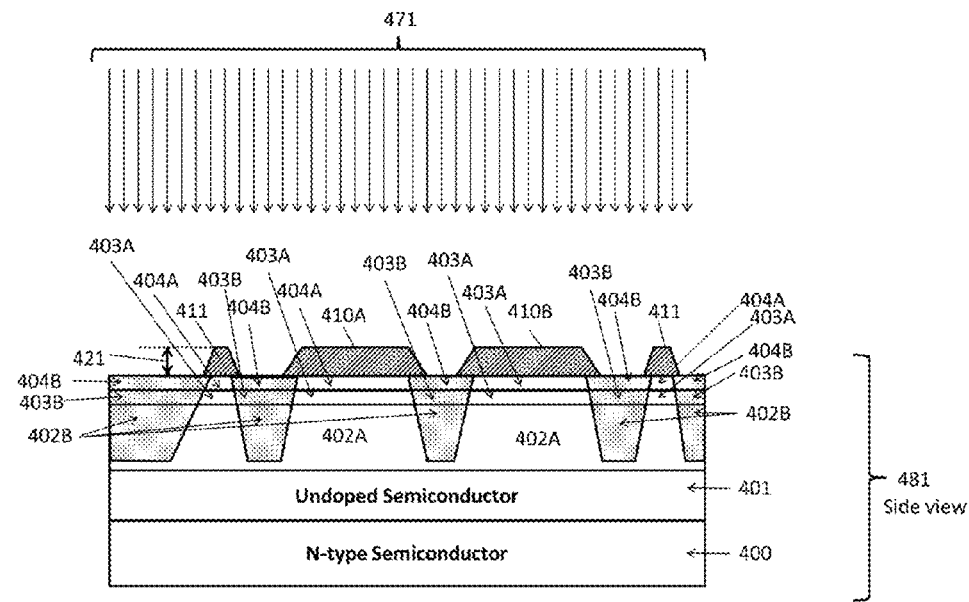
Figure 10:
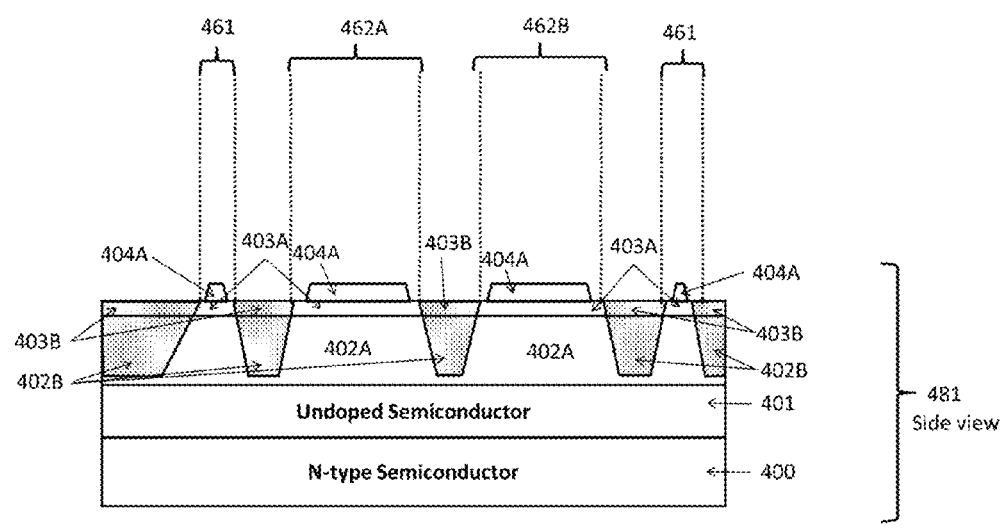
Figure 11:
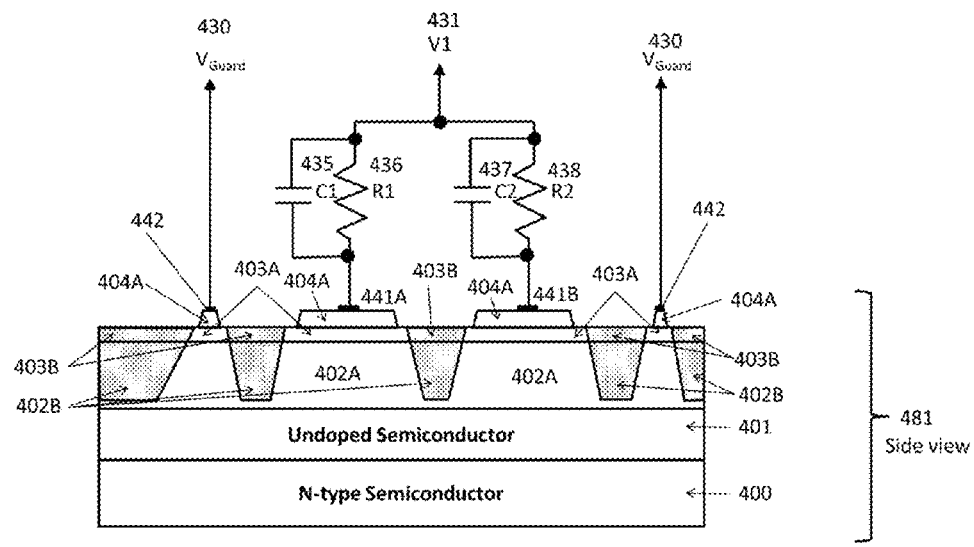
Figure 12:
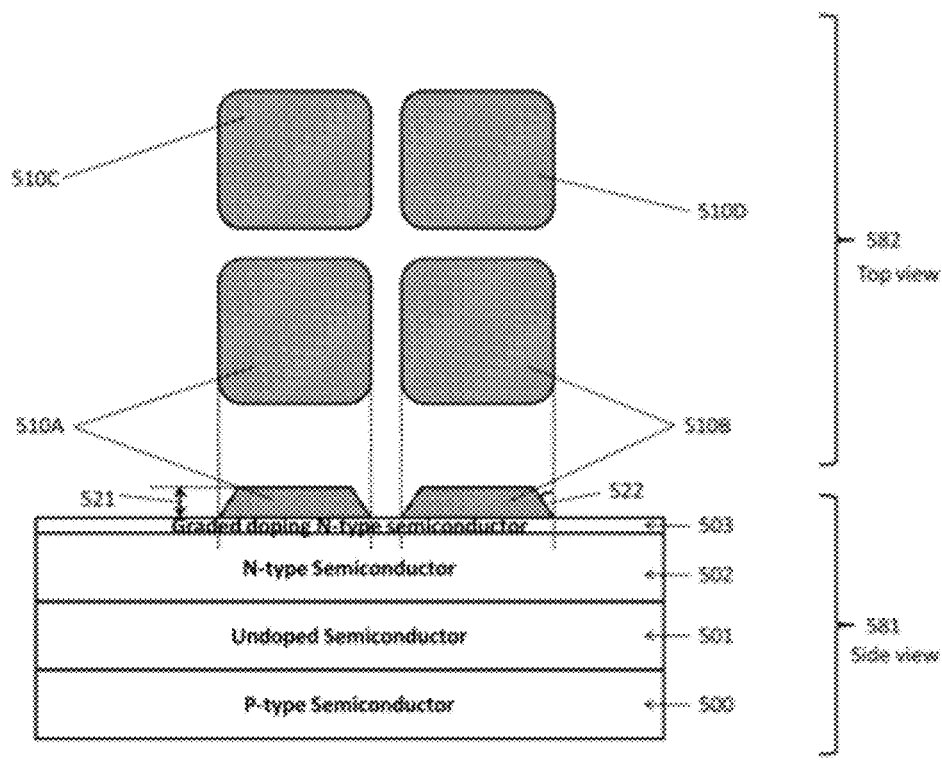
Figure 13:
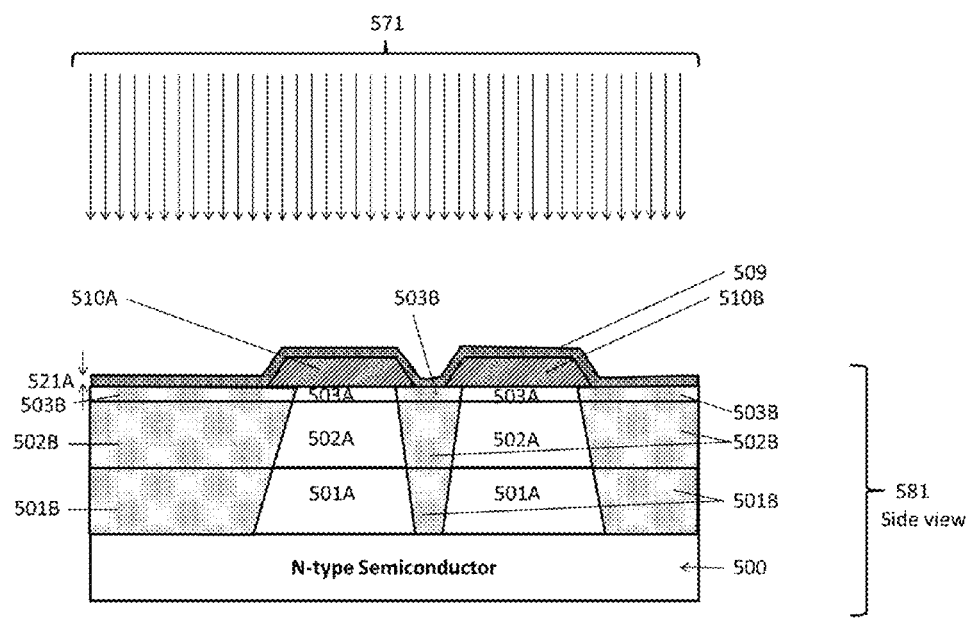
Figure 14:
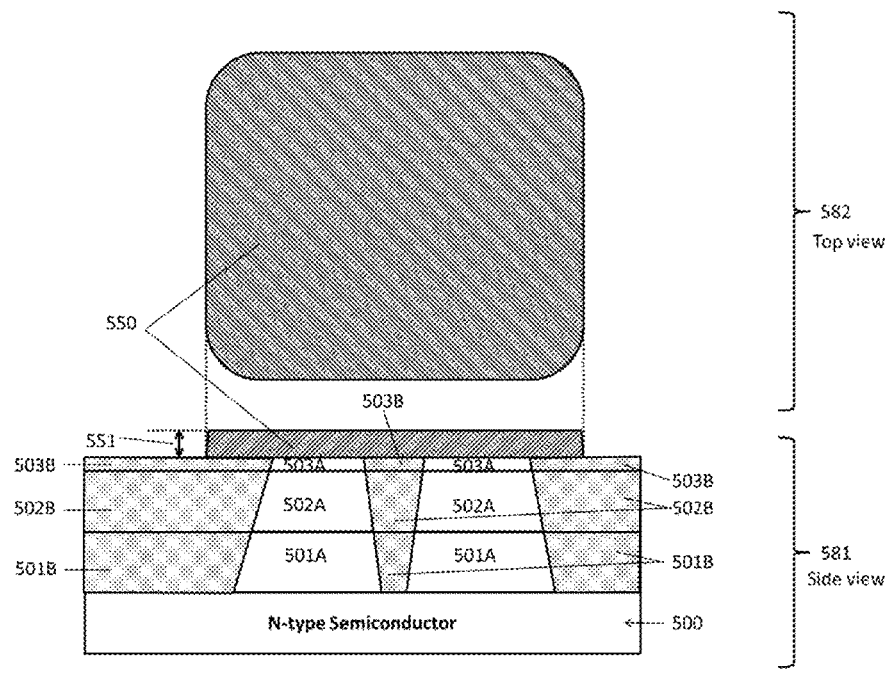
Figure 15:
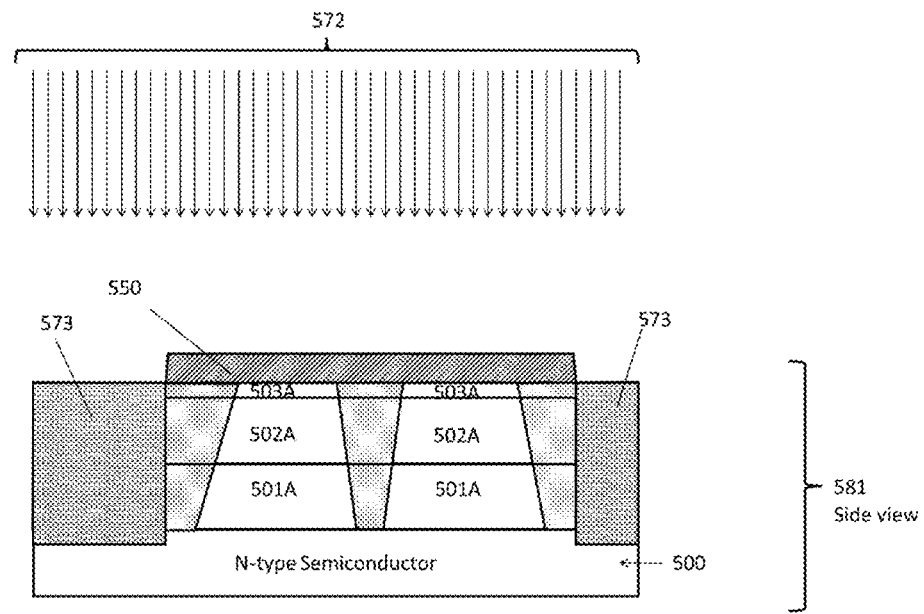
Figure 16:
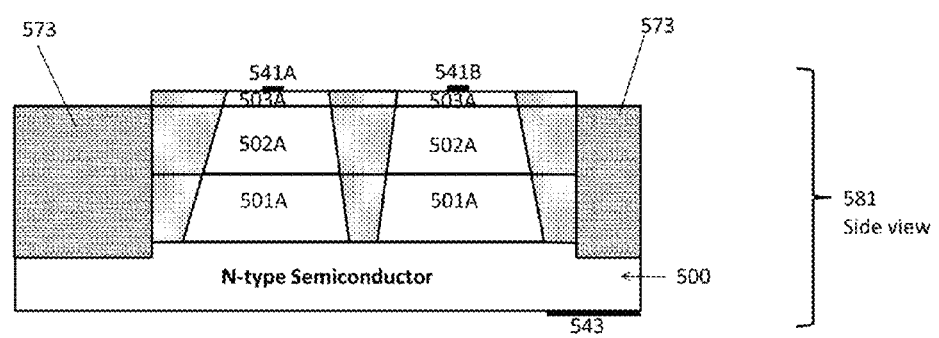
Figure 17:
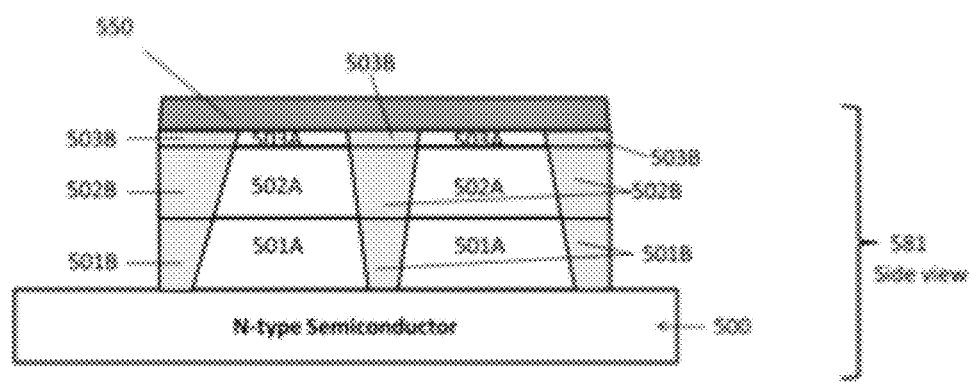
Figure 18:
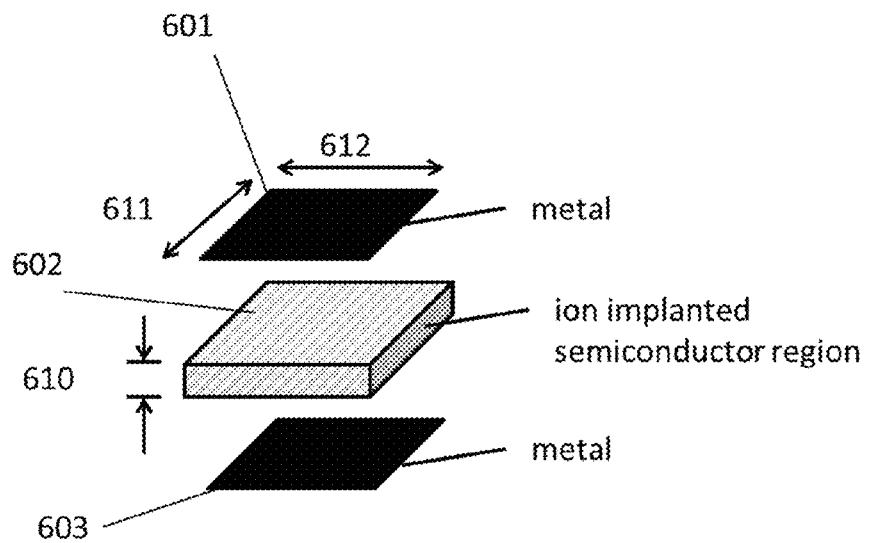
Figure 19:
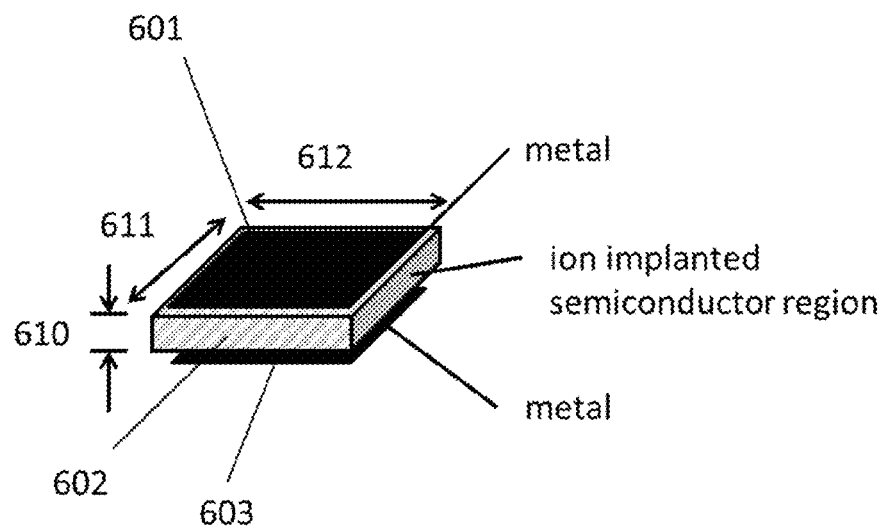
Figure 20:
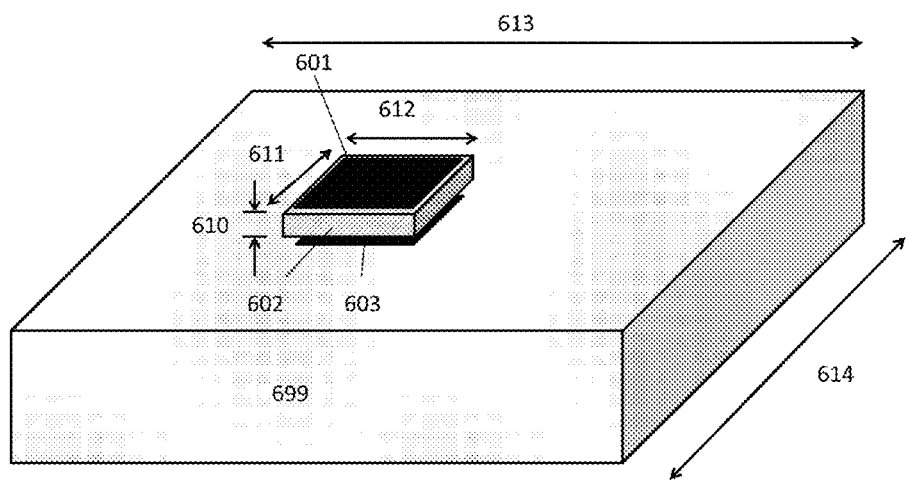
Figure 21:
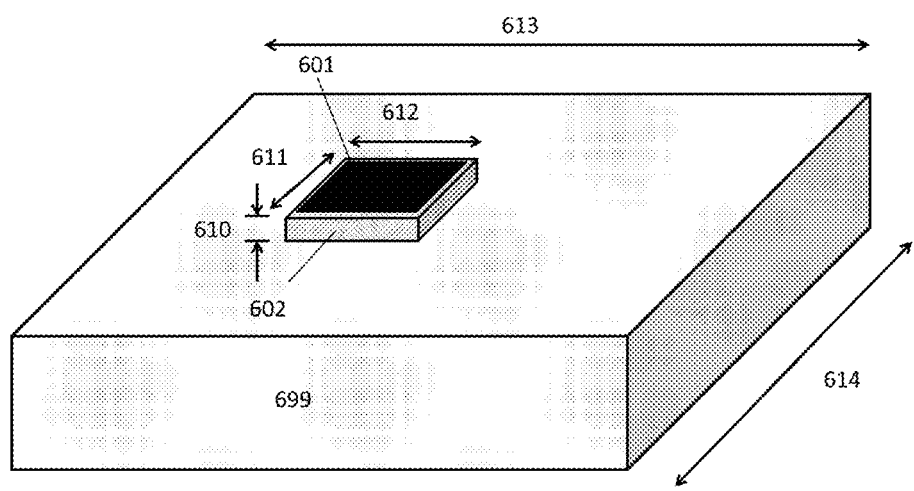
Figure 22:
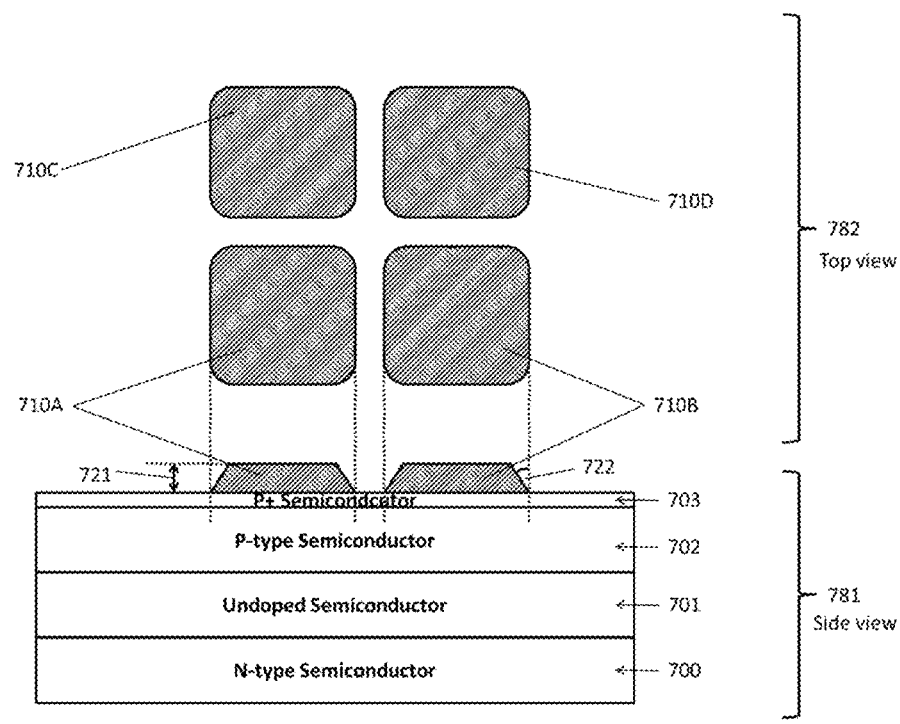
Figure 23:
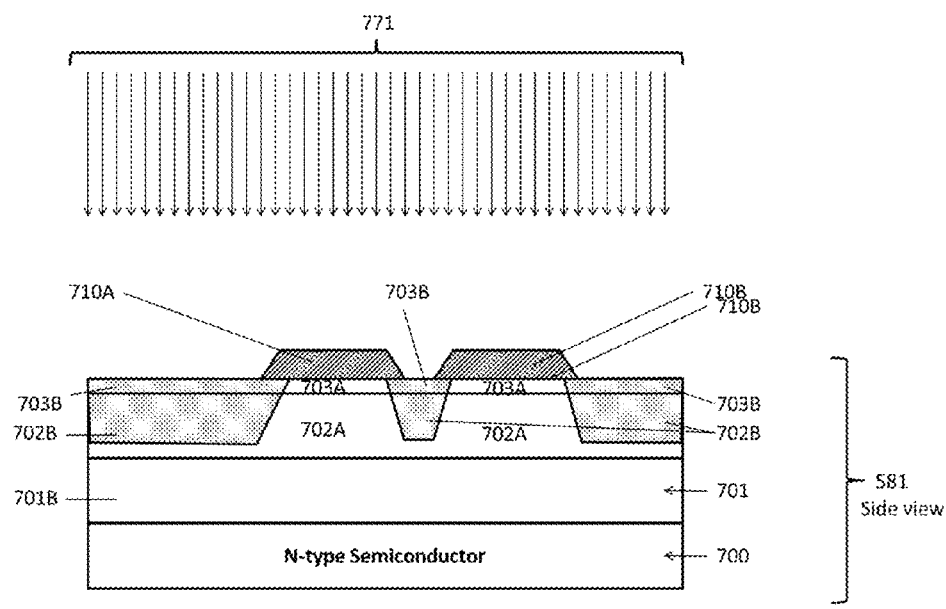
Figure 24:
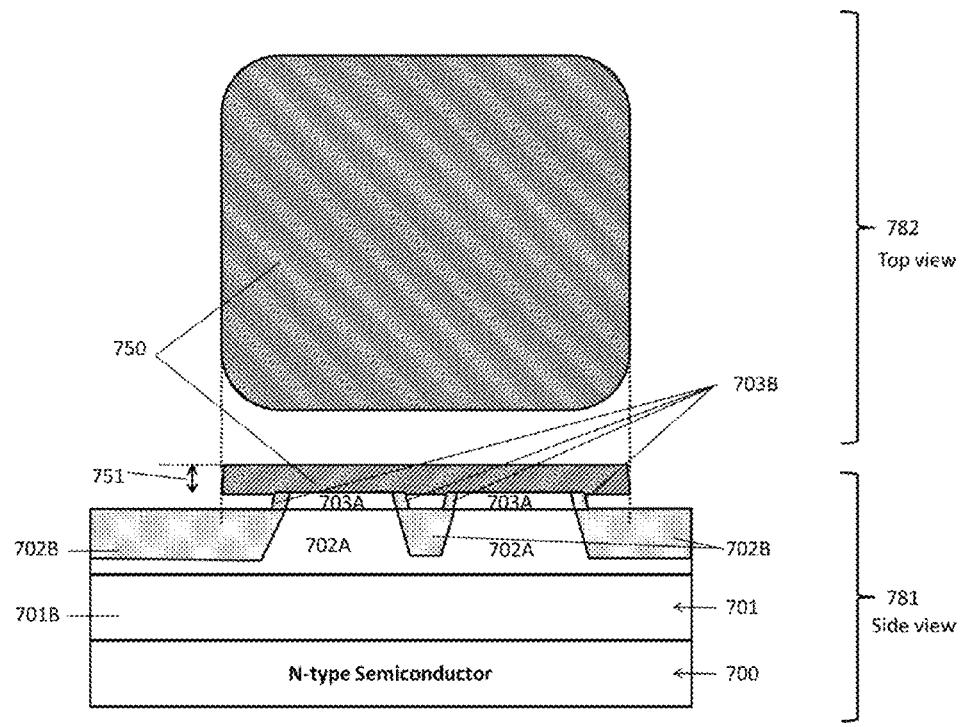
Figure 25:
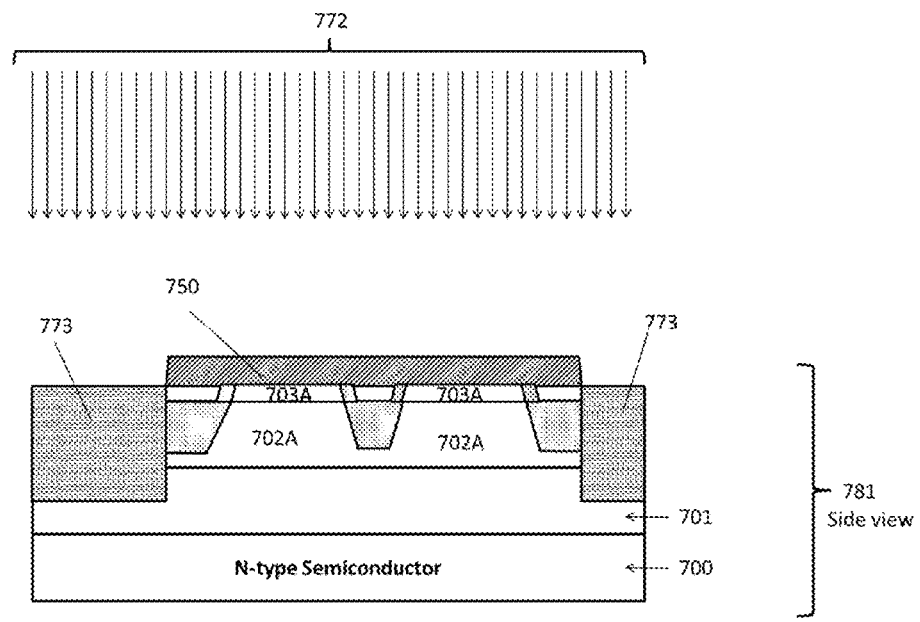
Figure 26:
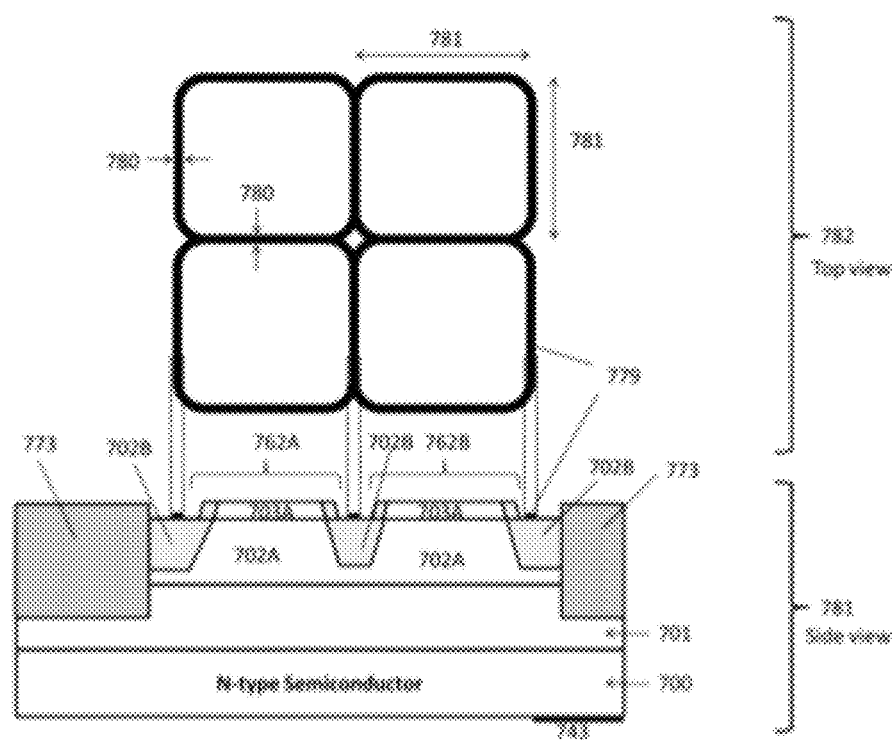
Figure 27:
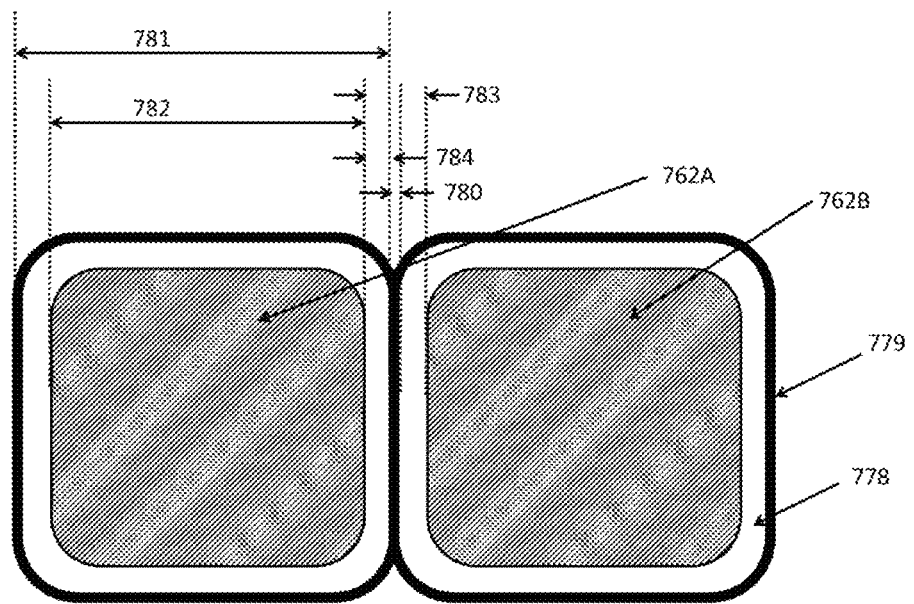
Figure 28:
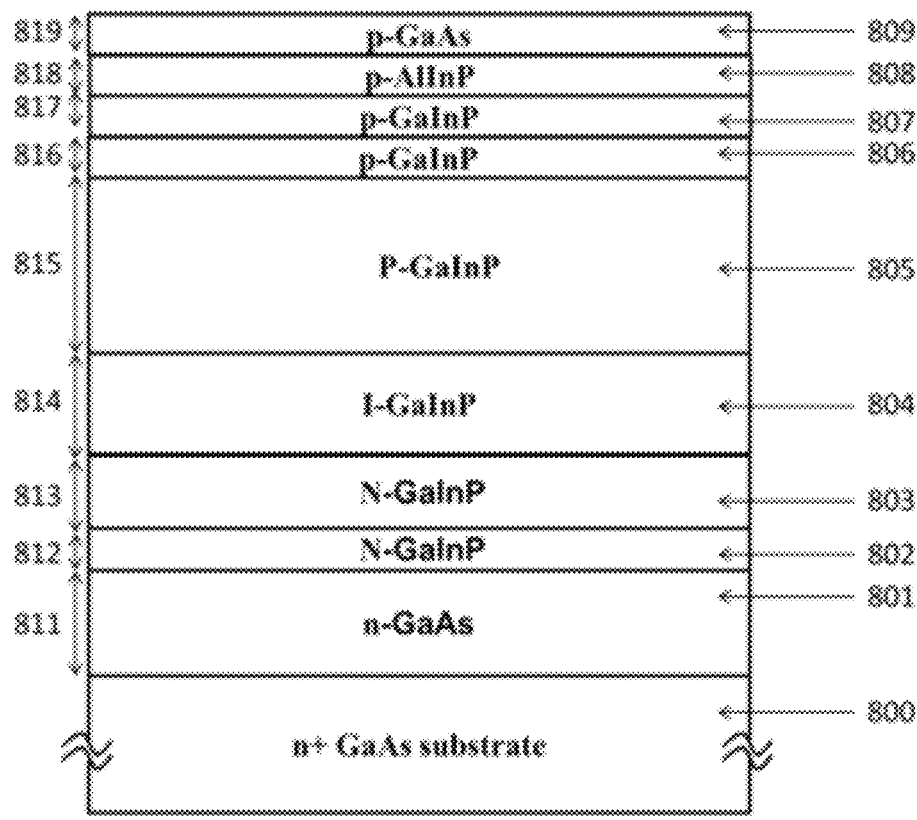
Figure 29:
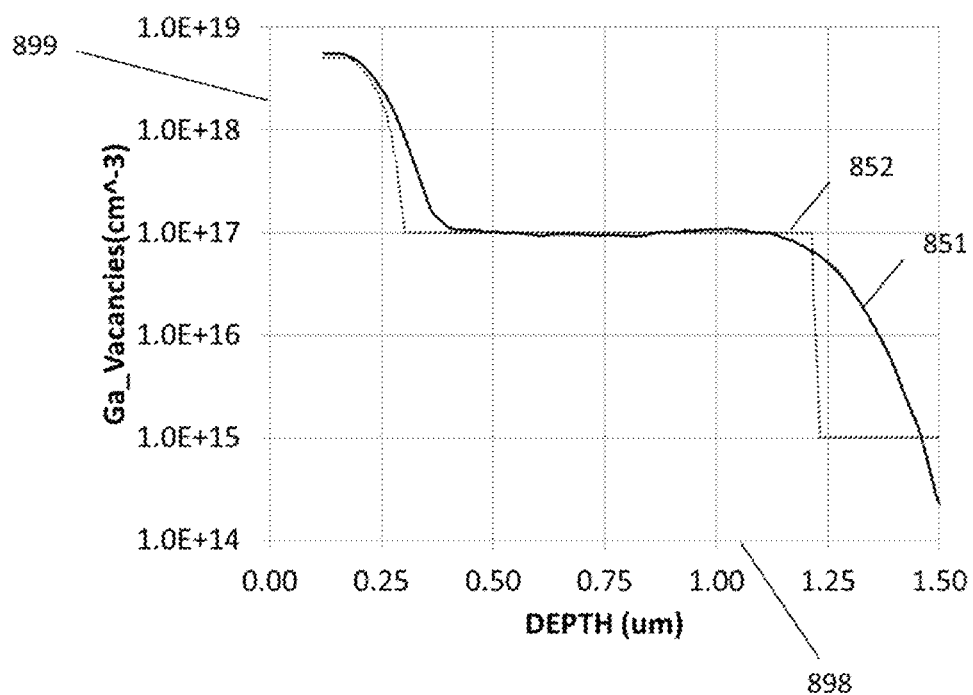

FIG. 6, which shows a final virtual beveled edge mesa structure at the completion of processing according to one method hereof;

FIG. 7 illustrates an exemplary current-voltage characteristic of an APD structure;

FIG. 8 illustrates an exemplary APD array according to some embodiments;

FIG. 9 illustrates a side view of an APD array following ion implantation and formation of virtual beveled-edge mesa structures in said array;

FIG. 10 illustrates the preceding structure after ion implantation;

FIG. 11 illustrates the preceding structure after connection of ohmic contacts and circuitry;

FIG. 12 illustrates another exemplary embodiment of a semiconductor APD array according to the present invention;

FIG. 13 illustrates blanketed masking over semiconductor structure;

FIG. 14 illustrates the effect of a first ion implantation step;

FIG. 15 illustrates a second ion implant stage;

FIG. 16 illustrates further steps of fabricating the preceding APD structure;

FIG. 17 illustrates an alternative means of isolating the array from the exterior regions of the chip or die;

FIG. 18 illustrates an exploded tri-layer structure for use in a circuit of the present APD structures;

FIG. 19 illustrates a similar tri-layer structure as the preceding that is un-exploded;

FIG. 20 illustrates a MIS tri-layer structure integrated into a SPAD;

FIG. 21 illustrates a MIS tri-layer structure on a SPAD;

FIG. 22 illustrates yet another APD array and method of making the same;

FIG. 23 illustrates a first ion implant process on the preceding structure;

FIG. 24 illustrates the result of a second implant on the preceding structure;

FIG. 25 shows further steps in the processing of the preceding APD structure;

FIG. 26 illustrates details of pixels of an APD array according to the preceding structure;

FIG. 27 describes some dimensional details of the preceding pixels;

FIG. 28 illustrates an embodiment of the layer structure used to form the virtual beveled edge mesa structure; and FIG. 29 illustrates a plot of depth versus density for the preceding structure.

DETAILED DESCRIPTION

As discussed above, the present inventions provide a number of improvements and new devices and methods for making and using the same, including for single photon avalanche detector devices.

Figure 2:
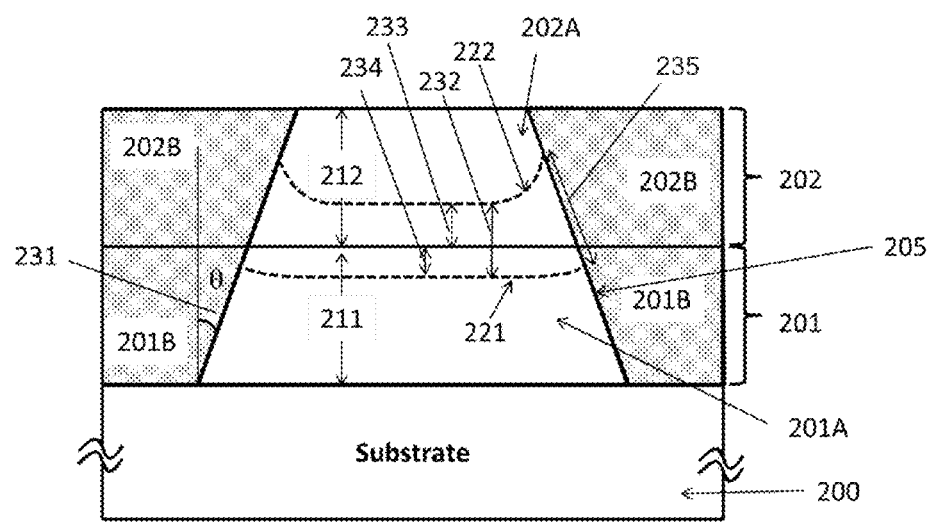
FIG. 2 illustrates an embodiment of a virtual positive beveled edge mesa structure that can be used in a photodetector device.

FIG. 2 illustrates an exemplary embodiment of a device usable in a photodetector, having a virtual positive beveled edge mesa structure. That is, the mesa structure has angled, sloping or non-vertical walls with respect to the surfaces that define the layer interfaces of the structure. In yet other words, the mesa is defined by lateral boundaries that have a positive angle with respect to a normal to the planes of the layers of the structure. This angle is generally designed to create a larger area of the structure closer to the substrate and a narrowing or tapering to a smaller area of the structure where it is further away from the substrate.

The structure is generally achieved by a plurality of layers of material of selected thicknesses disposed over a substrate layer. While the drawings depict the substrate to be on the bottom and the other layers above the substrate, obviously, the device can be rearranged, rotated or flipped in actual making and use. Therefore, the conventional arrangement with the substrate being on the bottom of the drawings is merely for illustration and not by way of limitation.

The virtual mesa structure of FIG. 2 is achieved by using ion implant isolation through a beveled edge mask to achieve the desired geometry and to reduce the net doping in the implanted region compared to the unimplanted region. In some embodiments, the net doping of the implanted region can be reduced by an order of magnitude or more compared to the unimplanted region. The virtual positive beveled edge mesa structure takes advantage of the smaller lateral extent of the p-type semiconductor region compared to the n-type semiconductor region in the APD pixel, enabling the magnitude of the electrical field to be smaller near the perimeter of the device compared to the central portion of the APD pixel. Those skilled in the art will appreciate that the present examples, when describing a type of doping (n-type, p-type) could be modified in some applications to use the converse type of doping (p-type, n-type).

Figure 1:
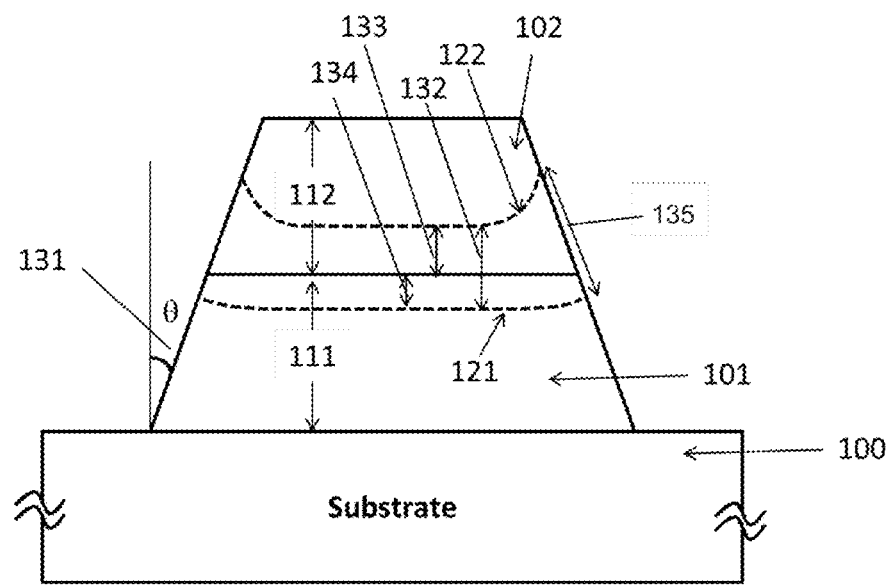
FIG. 1 illustrates a physical mesa structure that can be used in a prior art photodetector device.

FIG. 2 illustrates a virtual beveled edge mesa sidewall 205 in accordance with an exemplary embodiment. The geometries and dimensions of the implant isolated semiconductor regions 201B and 202B are chosen to achieve a positive bevel angle 231 between the implanted regions 201B and 202B and the non-implanted regions 201A and 202A as shown in the Figure. In this embodiment, the implant isolated semiconductor region is used to entirely confine the lateral extent of the p-type semiconductor region 202A and the n-type semiconductor regions 201A of the virtual beveled edge APD structure. In the shown embodiment, an n-type semiconductor region 201 and a p-type semiconductor region 202 are grown on top of an n-type semiconductor substrate 200. Implant isolation through a beveled mask (to be discussed below) is used to define the lateral geometry of the implant. Regions 201B and 202B are the implanted volume of layers 201 and 202 respectively, with the isolation implant chosen to compensate the doping of regions 201B and 202B by at least an order of magnitude in some embodiments, and consequently increase the resistivity of regions 201B and 202B in some embodiments by at least an order of magnitude compared to the unimplanted regions 201A and 202A. The thickness of layer 201 is 211 and the thickness of layer 202 is 212. The thickness of the depletion region in the center of the n-type region 201A is 234, while the thickness of the depletion region in the center of n-type region 202A is 233, and the total depletion region thickness in the center of the device is 232, while the thickness of the depletion region along the virtual beveled mesa edge 205 is 235. Therefore, the concept of the virtual mesa where a suitably angled or beveled region of one or more layers of the device act in lieu of the physical mesa of the prior art of FIG. 1 is defined. The virtual mesa comprising unimplanted doped regions 201A and 202A constrained within implanted regions 201B and 202B of layers 201 and 202 offer performance and fabrication and other advantages over the prior art. For example, the virtual mesa does not require a physical extension of the mesa above the layers of the device as was required in the prior art of FIG. 1.

The combination of using a higher magnitude of the n-type doping in layer 201 compared to the magnitude of the p-type doping in layer 202, combined with the virtual bevel angle 231 and the passivating properties of 201B and 202B enable the width 235 of the depletion region along the outer virtual beveled mesa edge 205 to be longer than the width of the depletion region 232 in the center of the device, which can be used to effectively mitigate perimeter effects in this device. That is, the electrical field gradient near the center region of the virtual mesa is greater than the electrical field gradient near the outer edge regions of the virtual mesa because the depletion regions near the center of the mesa structure are thinner than they are near the outer edges thereof.

Figure 3:
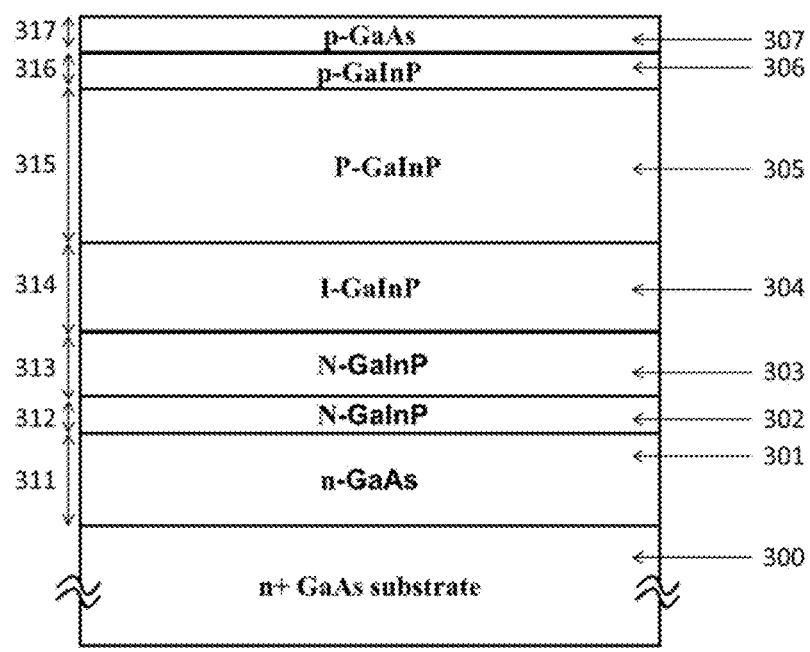
FIG. 3 illustrates an exemplary multi-layer structure over a substrate.

We next illustrate embodiments of a photodetector device and method of making the same where the device has the virtual beveled edge mesa structure described above. FIG. 3 illustrates the starting layer structure of the device, comprising semiconductor layers grown on a n+ GaAs substrate 300. In an aspect, these layers are grown using metal-organic chemical vapor deposition. Those skilled in the art will recognize that any suitable ways of achieving the layered structure shown can be used. Layer 301 of thickness 311 is a n-type GaAs buffer layer grown directly on top of substrate 300, and is used to initiate high quality epitaxial growth. Layer 301 comprises a GaAs layer doped n-type to a doping density of $5 \times 10^{17}$ cm^3 and grown to a thickness 311 of 500 nm. Layer 302 comprises a Ga0.51In0.49P layer doped n-type to a doping density of $5 \times 10^{18}$ cm^3 and grown to a thickness 312 of 50 nm. Layer 303 comprises a Ga0.51In0.49P layer doped n-type to a doping density of $1 \times 10^{18}$ cm^3 and grown to a thickness 313 of 100 nm. Layer 304 comprises a not deliberately doped Ga0.51In0.49P layer grown to a thickness 314 of 250 nm, meaning generally that the layer may include some dopant. Layer 305 comprises a Ga0.51In0.49P layer doped p-type to a doping density of $1 \times 10^{17}$ cm^3 and grown to a thickness 315 of 950 nm. Layer 306 comprises a Ga0.51In0.49P layer doped p-type to a doping density of $5 \times 10^{18}$ cm^3 and grown to a thickness 316 of 50 nm. Layer 307 comprises a GaAs contacting layer doped p-type to a doping density of $5 \times 10^{19}$ cm^3 and grown to a thickness 317 of 120 nm. The thickness 317 of layer 307 is chosen, in part, to both enable good ocontacts to be achieved as well as to provide a sacrificial layer for the isolation implant, which enables a He+ implant with an energy of 15 keV to be used with the peak of the ion implantation damage occurring in layer 306, which can have a factor of 50-fold higher doping than layer 305, so requires approximately 50-fold higher damage.

It bears repeating that the dimensions, materials, concentrations and other specific examples provided herein are merely illustrative, and those skilled in the art would appreciate other particular implementations suited for one purpose or another upon review of the present disclosure. As such, none of the parameters and quantitative values given herein are meant to be limiting. This includes the ordering and polarity of the constituent layers of a given embodiment, which can also be modified as needed to suit a particular application.

Figure 4:
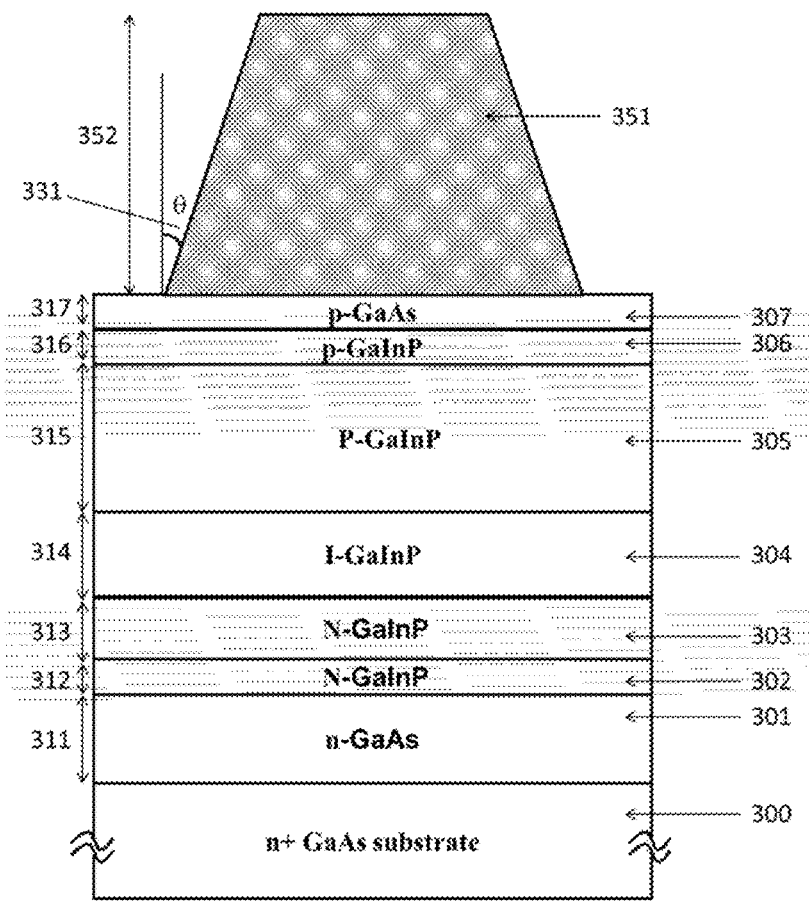
FIG. 4 illustrates an exemplary profile of a silicon dioxide mask over a plurality of semiconductor layers of a device.

FIG. 4 illustrates an exemplary profile of a silicon dioxide mask 351, which was deposited to a thickness 352, which in an embodiment can be about 1,800 nm, using electron cyclotron resonance (ECR) plasma enhanced chemical vapor deposition (ECR-PECVD). As stated before, the exemplary materials and dimensions provided herein are illustrative and not meant to be limiting. Those skilled in the art can appreciate other geometries and sizes for the elements described.

Silicon dioxide layer 351 is then patterned into the mesa shape shown in the drawing using photolithography and wet chemical etching, producing a bevel angle 331, which is approximately 45 degrees because wet chemical etching is roughly isotropic. The angle and thickness of the mask may be varied to suit a particular need. After the photoresist is removed, the structure is implanted with He+ ions using the energies and doses shown in Table I. The implantation angle is normal to the surface of the wafer since the layer structure of FIG. 4 is grown on a 100 GaAs substrate offcut 10 degrees towards the 111A direction, said angles and thicknesses being exemplary. The energies and doses in Table I were calculated using the stopping range of ions in matter in this example.

Table I illustrates exemplary He+ ion energies and doses used to implant the layer structure of FIG. 3A to form the virtual beveled edge mesa.

TABLE I

| $He^+$ ion energy | Dose |
|---|---|
| 15 keV | $2.5E13/cm^2$ |
| 25 keV | $0.8E11/cm^2$ |
| 70 keV | $4.4E11/cm^2$ |
| 120 keV | $3.2E11/cm^2$ |
| 195 keV | $1.0E11/cm^2$ |

Figure 5:
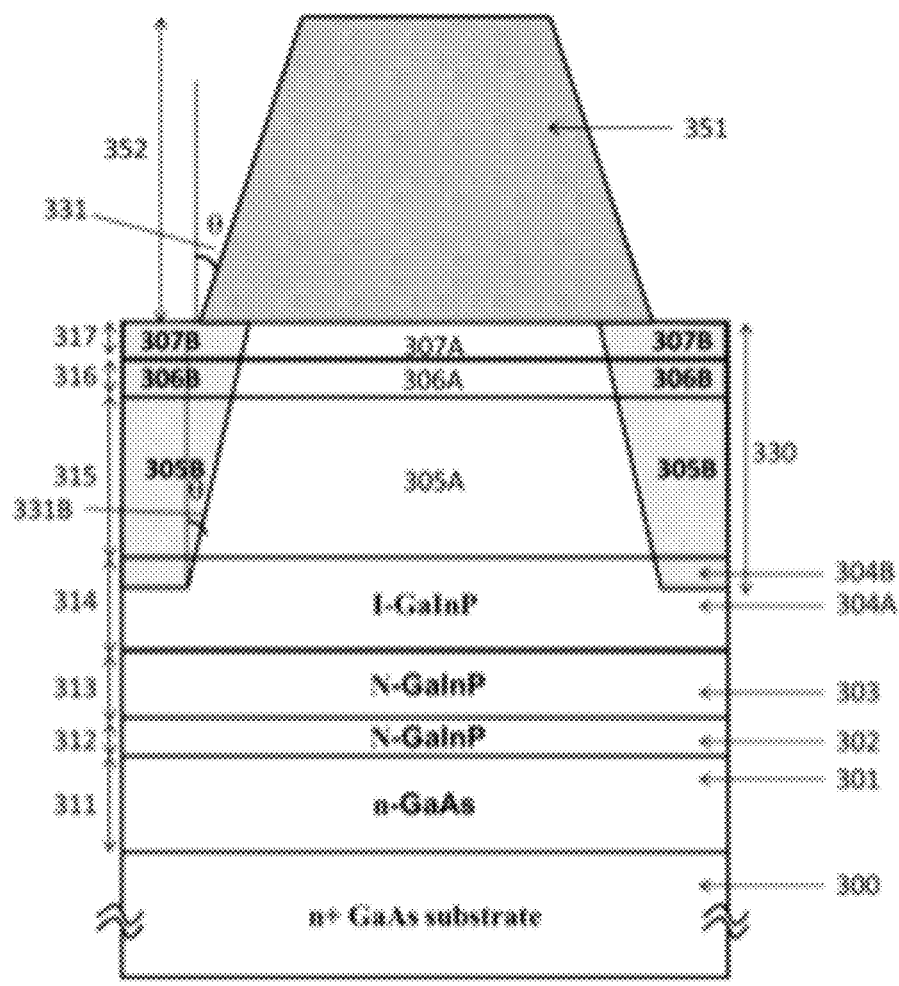
FIG. 5 illustrates the result of the He+ ion implantation into the structure of FIG. 4.

FIG. 5 illustrates the result of the He+ ion implantation into the structure of FIG. 4. Regions 304B, 305B, 306B, and 307B are the portions of layers 304, 305, 306 and 307 respectively, that are exposed to the isolation implant, while regions 304A, 305A, 306A, and 307A are the regions of layers 304, 305, 306, and 307 respectively that are protected from the isolation implant by mask 351. The resulting regions 307A, 306A, 305A, and 304A form the virtual beveled mesa structure with a bevel angle of 331B. Those skilled in the art might appreciate that while the implant energies chosen may not fully penetrate through layer 304, efficient isolation of the p-type layers (layers 305, 306, and 307) can be achieved, because the PN junction causes the relevant regions of layer 304 to be fully depleted. Those skilled in the art might also appreciate that different implantation energies and doses may be utilized as long as the resulting beveled edge mesa structure is achieved and as long as the implanted regions exhibit at least an order of magnitude lower free carrier concentration than the unimplanted regions. Upon completion of the implant, the entire structure is annealed to partially heal the implant damage and to stabilize the structure.

Next, the silicon dioxide mask 351 is used as a mask for etching the p+ GaAs layer 307 to remove this layer as a conductive pathway, with the final resulting structure shown in FIG. 6.

Reference is now made to FIG. 6, which shows the final virtual beveled edge mesa structure at the completion of processing. Metal contact 398 forms an ocontact to p+ GaAs layer 307A, and metal contact 399 forms an ohmic contact to the n-GaAs substrate 300.

FIG. 7 illustrates an exemplary current-voltage characteristic of an APD structure fabricated in accordance with the foregoing disclosure. The diameter of the virtual beveled edge mesa is approximately 50 microns, and the implant anneal temperature was 400° C. Axis 371 represents the voltage axis, with the voltage running from −35 volts to 0 volts on a linear scale as shown. Axis 372 represents the current axis, with the current running from 1E-12 amps to 1E-3 Amps on a logarithmic scale as shown. These values are merely exemplary and not limiting of the present invention or embodiment. Curve 375 represents the dark current, showing that the virtual beveled edge device achieves an unmultiplied dark current below 10 pA. Curve 376 represents the light current. The inset shows the region of the curve near breakdown, with voltage axis 371B running from −35 volts to 30 volts on a linear scale as shown in the drawing. The inset also includes an additional axis 371B, showing the calculated gain of the device with axis 371B running from a gain of 1 to a gain of 1000 as on a logarithmic scale shown. Curve 377 in the inset represents the calculated gain, showing the device is capable of exhibiting gains in excess of 100.

This device can also be operated in a Geiger mode using an external quench circuit and operated at a voltage of 34.6V (approximately 1 volt of excess bias). The device demonstrates a dark count rate between 50-60 kcps and an internal single photon detection efficiency in excess of 20%, indicating that the virtual beveled edge mesa structure was successful. The internal single photon detection efficiency is defined as light counts divided by the photocurrent (in units of electrons/second), where a low value of photocurrent is achieved by attenuating a light source with neutral density filters. Since the SPAD device is used to measure the unattenuated photocurrent, this measurement ignores the effects of surface reflection, shadowing, and recombination losses.

FIG. 8 illustrates a side view 481 of an exemplary semiconductor layer structure, including mask features 410A, 410B, and 411, and a top view 482 of a first mask used to process APDs in accordance with the invention. In side view 481, the device layer structure is simplified, showing only the n-type semiconductor region 400, a non-intentionally doped region 401, the p-type semiconductor layer 402, a graded doped p-type layer 403, and a heavily doped p-type contacting layer 404. The combination of layers 402, 401, and 400 form a PIN diode structure, which forms the basis for the avalanche photodiode structure of the invention. Layer 403 is added on top of the PIN diode structure to provide a smooth grading between the p-type semiconductor layer 402 and the heavily doped p-type contacting layer 404.

The grading of the doping in layer 403 is chosen provide an approximate match between the doping profile and the implant damage profile as will be discussed below. Approximate matching between the doping profile and the implant damage profile is desirable because otherwise it may be necessary to over-implant or under-implant regions of the device. In the case of over-implanted regions, the implant isolation dose may be too high, which causes too large a defect density, resulting in an increased thermal generation rate and less effective isolation. In the case of under-implanted regions, the implant isolation dose may be too low, which causes too small a defect density, resulting in insufficient compensation of the donor atoms and increased conductivity. For the case of abrupt doping changes between layers, it is likely that at least a part of one of the layers will be either over-implanted or under-implanted, resulting in sub-optimal performance.

Heavily doped p-type contacting layer 404 provides a means of achieving ohmic contact to the PIN diode, as well as providing a way of minimizing the surface depletion region due to surface Fermi level pinning. Such surface depletion and surface Fermi level pinning degrade the quantum efficiency of PIN diodes for shorter wavelengths that are absorbed near the surface. Of course, the structure could be inverted, forming a NIP diode structure, and that APD device design does not require the use of an undoped region 401, so the invention is also suitable with PN and NP layer designs.

FIG. 8 is directed to a design of an exemplary four-pixel APD array, and therefore includes mask regions 410A, 410B, 410C, and 410D, which are used to define the virtual beveled mesas of pixels 1, 2, 3, and 4 respectively (the numbering of the pixels is not material to the invention and is arbitrary of course).

The number of pixels in an array and their arrangement is general and can be implemented in other configurations than the ones illustrated. In the illustrated embodiment, the mask also includes a guard ring 411, which surrounds the perimeter of the entire array, and provides a means of isolating the pixels of the array from anything in the exterior of the guard ring (such as other regions of the semiconductor chip or die. As shown in the side view 481, the mask pattern of the top view 482 is replicated in a beveled masking material of thickness 421 and bevel angle 422. The thickness of the masking material should be chosen to be sufficient to stop substantially all of the implant ions from reaching p-type layer 402 underneath the mask. The masking material can include wet or dry etched silicon dioxide, silicon nitride, metal, or photoresist, provided bevel angle 422 is sufficient to produce the virtual beveled edge of the invention. Furthermore, while the bevel angle 422 shown in the side view 481 of the figure is trapezoidal, the invention can make use of any curved shape for the mask edge, provided that the thickness of the mask varies from a small thickness to the full thickness 421 near the regions were a virtual beveled edge is desired.

FIG. 9 illustrates the effect of ion implantation on the side view 481 of FIG. 8. Incident ions 471 are accelerated towards the substrate in an ion implantation machine. Said incident ions 471 are blocked by the full thickness 421 of masking layers 411, 410A, and 4108, and are allowed to pass into layers 404, 403 and 402 in the clear openings of the mask. In the beveled edge regions of the mask, the incident ions 471 are scattered by the masking material, decreasing the energy of said incident ions 471, and thereby providing a variable penetration depth of said ions 471 depending on the thickness of the mask layer through which they travel. The net result is a roughly trapezoidal shape to the implanted regions (402B and 403B) as shown in the drawing. This trapezoidal shape to the implanted regions is for illustrative purposes only, and will be somewhat rounded by the lateral spread and scattering of ions as they penetrate through the masking and semiconductor device layers. Implanted regions 404B are the portions of layer 404 where the incident ions deposit a substantial fraction of their energy, resulting in a relatively large defect density that acts to partially compensate the p-type doping of layer 404. Note that full compensation of layer 404 is not a requirement, as subsequent processing steps can be used to remove (etch) regions 404B, eliminating any residual conductivity through these regions. Regions 403A are the regions of layer 403 that are largely unimplanted, and therefore retain a substantial fraction of their original p-type doping, free carrier concentration and resistivity. Similarly, regions 403B are the regions of layer 403 that are implanted, while regions 403A are the regions of layer 403 that are largely unimplanted. And, regions 402B are the regions of layer 402 that are implanted, while regions 402A are the regions of layer 402 that are largely unimplated. Note that the transition between the implanted region and the unimplanted region may not be abrupt, but may rather gradually transition from a high damage region (implanted region) to a low damage region (unimplanted region) in accordance with the ion trajectories. Such ion trajectories can be modeled using Monte Carlo analysis software.

The implanted ion can be any suitable ion, provided it provides a means of compensating the doping of the layers. For III-V compound semiconductors, the ion candidates include, but are not limited to hydrogen, helium, oxygen, nitrogen, arsenic, and phosphorous. In addition, doping ions such as silicon and tin can be considered, since these ions would not only produce damage, but would also provide a source of counter doping for p-type layers 402 and 403 (and similarly, beryllium and zinc could be considered for n-type layers). For group IV semiconductors, ions such as oxygen, silicon, and argon could be used to create damage. See, e.g., C-T Huang, J-Y Li, and J. C. Sturm, "Implant Isolation of Silicon Two-Dimensional Electron Gases at 4.2K", IEEE Electron. Dev. Let. V. 34(1) Pp. 21-23 (January 2013). Other dopant ions could also be considered to provide a source of counter doping. One aspect of the invention is that the ion implantation provides a means of compensating a doped region and rendering it less conductive, for example a factor of ten times less conductive, with at least a factor of ten reduction in the net doping. In other aspects, it may be desirable to convert the implanted regions to the opposite semiconductor type, such as converting a p-type region to n-type or converting a n-type region to p-type, as long as said type conversion produces the desired virtual beveled mesa with a lower electrical field along the virtual bevel side wall compared to the center portion of the APD.

Upon completion of the ion implantation, the sample is typically annealed to heal some of the implant damage and stabilize the ion implanted regions. Additionally, the implanted regions 404B of layer 404 can be etched to prevent any residual conductivity of this heavily p-type region from impacting on device performance. The mask layer can then be removed, with the resulting side view structure shown in FIG. 10. In the figure, we see two pixels, 462A and 462B with their respective virtual beveled edge structure, as well as the surrounding guard ring 461.

Reference is now made to FIG. 11. To finish the fabrication, ohmic contact 442 is made to guard ring 461, ohmic contact 441A is made to the p-type side of APD 462A, ohmic contact 441B is made to the p-type side of APD 462B, and ohmic contact 443 is made to the n-type semiconductor substrate, providing a common cathode connection to all diodes of the array. To operate the APD array as a SPAD array, a passive quench circuit is connected to each APD element, consisting of a parallel connection of a resistor and capacitor as shown in the figure. Capacitor 435 and resistor 436 are connected to pixel 462A at contact 441A, and capacitor 437 and resistor 438 are connected to pixel 462B at contact 441B. A negative bias is supplied through connection 431 to provide the necessary bias to achieve Geiger mode operation of the APD elements. The output signal is read out through the common cathode connection at contact 443. In the figure, a simple load resistor 439 is connected between the common cathode connection 443 and ground 432, though those skilled in the art will recognize that more complex circuitry may be used to readout the current signal, including amplifier circuitry such as a transimpedance amplifier or a charge sensitive amplifier. In some embodiments, guard ring 461 may be left floating, while in other embodiments it may be desirable to connect guard ring 461 to a guard voltage 430 as shown in the figure. The common cathode connection 443 provides an analog summation of the currents through all of the APD pixels of the array, and when the APD pixels are operated in Geiger mode, provides a means of counting the number of single photons incident on the active are of the array.

Yet other embodiments and aspects of the invention are presented in the following discussion and drawings. FIG. 12 illustrates a side view 581 of the semiconductor layer structure, including mask features 510A and 510B, and a top view 582 of a first mask used to process APDs in accordance with the invention. In side view 581, the device layer structure is simplified, showing only the p-type semiconductor region 500, a non-intentionally doped region 501, the n-type semiconductor layer 502, and a graded doping n-type layer 503. The grading of the doping in layer 503 is chosen provide an approximate match between the doping profile and the implant damage profile as mentioned previously, with similar requirements to the graded doping layer 403 described above. The combination of layers 502, 501, and 500 form a NIP diode structure, which forms part of the avalanche photodiode structure. FIG. 12 illustrates the design of a four-pixel APD array, and therefore includes mask regions 510A, 510B, 510C, and 510D, which are used to define the virtual beveled mesas of pixels 1, 2, 3, and 4 respectively (which are arbitrary labels for the four pixels of the drawing). As shown in the side view 581, the mask pattern of the top view 582 is replicated in a beveled edge masking material of thickness 521 and bevel angle 522. The thickness of the masking material should be chosen to be sufficient to stop substantially all of the implant ions from reaching p-type layer 502 underneath the mask. The masking material can include wet or dry etched silicon dioxide, silicon nitride, metal, or photoresist, provided bevel angle 522 is sufficient to produce the virtual beveled edge of the invention. Furthermore, while the bevel angle 522 shown in the side view 581 of the figure is trapezoidal, the invention can make use of any curved shape for the mask edge, provided that the thickness of the mask varies from a small thickness to the full thickness 521 near the regions were a virtual beveled edge is desired.

FIG. 13 illustrates how a second masking layer 509 can be blanket deposited on top of the first masking layer (510A and 510B are shown, but masking layer 509 would also be deposited on top of 510C and 510D, not shown). Said blanket deposited second masking layer is deposited to a thickness 521B, said thickness 521B designed to enable the peak damage of the implant dose to be positioned in graded doping layer 503, mitigating the effects of the tail of the implant which would either result in an insufficient surface dose to compensate layer 503, or would require too large of a surface dose, potentially overcompensating the interface between layers 503 and 502, resulting in increased residual conductivity.

FIG. 13 illustrates the effect of a first ion implantation on the side view 581 of FIG. 12. Incident ions 571 are accelerated towards the substrate in an ion implantation machine. Said incident ions 571 are blocked by the full thickness 521 of masking layers 510A, and 510B, and are allowed to pass into layers 503, 502, and 501 in the clear openings between features 510A and 510B (the effect of second masking layer 509 is to slightly attenuate the energy of said incident ions 571, with the thickness of masking layer 509 chosen to allow substantially all incident ions to pass through second masking layer 509). In the beveled edge regions of the mask, the incident ions 571 are scattered by the masking material, decreasing the energy of said incident ions 571, and thereby providing a variable penetration depth of said ions 571 depending on the thickness of the mask layer through which they travel. The net result is a roughly trapezoidal shape to the implanted regions (501B, 502B, and 503B) as shown in the drawing. This trapezoidal shape of the implanted regions is for illustrative purposes only, and will be somewhat rounded by the lateral spread and scattering of ions as they penetrate through the masking and semiconductor device layers. Implanted regions 503B is the portion of layer 503 where the incident ions deposit a substantial fraction of their energy, resulting in a relatively large defect density that acts to compensate the n-type doping of layer 503. Regions 503A are the regions of layer 503 that are largely unimplanted, and therefore retain a substantial fraction of their original n-type doping, free carrier concentration and resistivity. Similarly, regions 502B are the regions of layer 502 that are implanted, while regions 502A are the regions of layer 502 that are largely unimplanted. Likewise, regions 501B are the regions of layer 501 that are implanted, while regions 501A are the regions of layer 501 that are largely unimplanted. The transition between the implanted region and the unimplanted region is not abrupt, but rather gradually transitions from a high damage regions (implanted regions) to low damage regions (unimplanted regions) in accordance with the ion trajectories. Such ion trajectories can be modeled using Monte Carlo analysis software.

Upon completion of the first ion implantation, mask layers 509, 510A, 510B, 510C, and 510D are removed using conventional techniques and the sample is typically annealed to a first anneal temperature to heal some of the implant damage and stabilize the ion implanted regions 501B, 502B, and 503B. Next, a second mask layer is deposited and patterned into the region 550, which is designed to protect the virtual beveled implant regions of the active pixels, and to expose the exterior of the APD array to a second ion implantation step.

FIG. 14 illustrates the patterned mask 550 having a thickness 551 which is sufficient to block nearly all of the incident ions of the second ion implantation from regions 502A. Note that the goal of the second implant is to isolate the APD array from the exterior regions of the chip or die, and therefore some implementations may use a conventional photoresist mask with vertical sidewalls (and therefore little or no bevel angle).

FIG. 15 illustrates the effect of a second implant 572 on the side view 581 from FIG. 14. Incident ions 572 provide implant isolation for the regions 573 outside the active area of the array as shown in the figure. This second implant isolation is typically chosen to maximize the sheet resistance of regions 573 to provide effective isolation between the active array and the exterior of the array on the chip or die, and therefore would typically be used instead of the guard ring 461 above, though alternative embodiments could incorporate both the guard ring and the second implant isolation.

FIG. 16 illustrates further steps in the making of the preceding APD array. Mask 550 is removed from the sample and the sample is annealed to a second anneal temperature to stabilize the implantation damage in regions 573 as well as to optimize the resistivity of regions 573. Said second anneal temperature will typically be lower than said first anneal temperature to enable separate optimization of implant regions 501B, 502B, 503B and 573. Next, conventional processing is used to deposit ohmic contacts 541A and 541B to APD pixels 1 and 2 respectively (taken arbitrarily to be the two pixels shown in this view), and to deposit ohmic contact 543 which provides an ohmic contact to the common cathode layer 500. The common cathode connection 543 provides an analog summation of the currents through all of the APD pixels of the array, and when the APD pixels are operated in Geiger mode, provides a means of counting the number of single photons incident on the active are of the array.

Reference is now made to FIG. 17, which shows an alternative means of isolating the array from the exterior regions of the chip or die. Here, the processing step represented by FIG. 17 would replace the processing step represented by FIG. 16, and no second implant would be used. Instead, mask 550 would be used to enable a conventional mesa isolation for the exterior portion of the array, and conventional wet or dry etching techniques can be used to achieve the structure shown in FIG. 17. Due to the fact that this mesa isolation is substantially separated from the virtual beveled edge mesa, the requirements for a beveled mesa angle and mesa sidewall passivation are substantially relaxed.

FIG. 18 illustrates an exploded view of a tri-layer structure such as a metal/insulating/metal (MIM) tri-layer structure that could be used to form a parallel connected capacitor and resistor structure. The structure comprises three layers including a first metal 601, an ion implanted leaky insulator semiconductor region 602 with thickness 610, and a second metal 603. The lateral dimensions of the MIM structure are 611 and 612. The ion implanted semiconductor region 602 consists of any semiconductor region that has been ion implanted to substantially increase the resistivity, such as is readily achieved with implant isolation. While the above structure consists of a vertical stack of first metal (M), leaky insulator (I), and a second metal (M), an analogous planar structure is easily formed using a lateral MIM structure, where the top metal and bottom metal are replaced by planar metal strips placed on top of a semiconductor with a small gap between the planar metal strips in a coplanar stripline configuration with gap dimensions of 0.1-10 microns.

Reference is now made to FIG. 19, which shows the non-exploded view of the MIM structure of FIG. 18. A benefit of these MIM structures is to provide the necessary combination of capacitance and resistance for the passive quench circuit for a SPAD element, with resistance values typically ranging from 10 kOhm to 100 MOhm and capacitance values ranging from 1 fF to 1000 fF. The capacitance value is typically chosen to be within an order of magnitude of the intrinsic capacitance of the APD element to be quenched, and the resistance value is chosen to provide the required RC time constant for the reset/recharge cycle, where R is the resistance of the MIM structure (and I is a leaky insulator) and C is the combined capacitance of the MIM structure, the intrinsic SPAD capacitance, and any additional stray or parasitic capacitance (to ground) at the node between the MIM structure and the APD. Those skilled in the art will recognize that the vertical MIM structure can be replaced with a vertical MIS structure, a planar MIS structure, a planar MIM structure, a planar SIS structure, or a vertical SIS structure.

FIG. 20 illustrates how the MIM structure of the preceding drawings can be monolithically integrated with a SPAD element 699. The SPAD element 699 has lateral dimensions of 613 and 614.

FIG. 21 illustrates how the tri-layer MIM of the preceding structures can be converted to a vertical MIS structure by removing the second metal 603 and placing the ion implanted semiconductor region 602 in intimate contact with the anode or cathode of SPAD 699. The elimination of the second metal 603 substantially simplifies processing, because the MIS structure can be simply formed directly on top of SPAD 699 using appropriate masking and ion implantation steps.

Now we present yet another set of embodiments of the present invention, including photo detector array structures involving the present virtual mesa structures, passive quench circuits, fabrication methods, and other aspects.

FIG. 22 illustrates a side view 781 of a semiconductor layer structure, including mask features 710A and 710B, and a top view 782 of a first mask used to process APDs in accordance with the invention. In side view 781, the device layer structure is simplified, showing only the n-type semiconductor region 700, a non-intentionally doped region 701, the p-type semiconductor layer 702, and a heavily doped p-type layer 703. As said elsewhere, those skilled in the art could appreciate that the preferred examples presented here can be modified without loss of generality to accommodate other array geometries, numbers of array elements, shapes and sizes, and doping types.

FIG. 22 illustrates the design of a four-pixel APD array, and therefore includes mask regions 710A, 710B, 710C, and 710D, which are used to define the virtual beveled mesas of pixels 1, 2, 3, and 4 respectively (the pixel numbering being arbitrary). As shown in the side view 781, the mask pattern of the top view 782 is replicated in a beveled edge masking material of thickness 721 and bevel angle 722. The thickness of the masking material should be chosen to be sufficient to stop substantially all of the implant ions from reaching p-type layer 702 underneath the mask. The masking material can include wet or dry etched silicon dioxide, silicon nitride, metal, or photoresist, provided bevel angle 722 is sufficient to produce the virtual beveled edge of the invention.

Reference is now made to FIG. 23, which illustrates the effect of a first ion implantation on the side view 781 of the preceding array. Incident ions 771 are accelerated towards the substrate in an ion implantation machine. Said incident ions 771 are blocked by the full thickness 721 of masking layers 710A, and 710B, and are allowed to pass into layers 703, and 702 in the clear openings between features 710A and 710B and adjacent to said features. In the beveled edge regions of the mask, the incident ions 771 are scattered by the masking material, decreasing the energy of said incident ions 771, and thereby providing a variable penetration depth of said ions 771 depending on the thickness of the mask layer through which they travel. The net result is a roughly trapezoidal shape to the implanted regions (701B, and 702B) as shown in the drawing. Implanted regions 703B is the portion of layer 703 where the incident ions deposit a substantial fraction of their energy, resulting in a relatively large defect density that acts to compensate the p-type doping of layer 703. Regions 703A are the regions of layer 703 that are largely unimplanted, and therefore retain a substantial fraction of their original p-type doping, free carrier concentration and resistivity. Similarly, regions 702B are the regions of layer 702 that are implanted, while regions 702A are the regions of layer 702 that are largely unimplanted.

Upon completion of the first ion implantation the devices are annealed to a first anneal temperature to heal some of the implantation damage and stabilize the ion implanted regions 702B. Next, mask regions 710A, 710B, 710C, and 710D are used to etch regions 703B to prevent any residual conductivity through these layers. Mask regions 710A, 710B, 710C, and 710D are removed using conventional techniques. Next, a second mask layer is deposited and patterned into region 750, which is designed to protect the virtual beveled implant regions of the active pixels, and to expose the exterior of the APD array to a second ion implantation step. The patterned mask 750 has a thickness 751 which is sufficient to block nearly all of the incident ions of the second ion implantation from regions 702B. Note that the goal of the second implant is to isolate the APD array from the exterior regions of the chip or die, and therefore some implementations may use a conventional photoresist mask with vertical sidewalls (and therefore little or no bevel angle).

FIG. 24 illustrates the effect of a second implant 772 on the side view 781 from the preceding drawings. Incident ions 772 provide implant isolation for the regions 773 outside the active area of the array as shown in the drawing. This second implant isolation is typically chosen to maximize the sheet resistance of regions 773 to provide effective isolation between the active array and the exterior of the array on the chip or die.

FIG. 25 shows further steps in the processing of the preceding APD structure. Metal 779 is deposited into the gaps between pixels 1, 2, 3, and 4, and form a lateral MIS structure, where the metal "M" region of the MIS structure is metal 779, the leaky insulator "I" region of the MIS structure is ion implanted regions 702B, and the semiconductor "S" region of the MIS structure is the combination of regions 703A and 702A. Metal 779 has a width 780 and lateral dimensions 781 as shown in the drawing. The active area of pixel 1 is denoted 762A and the active area of pixel 2 is denoted 762B. Contact 743 forms the common cathode connection to the n-type semiconductor region 700. Bias can be applied to the structure by applying a suitable bias between contacts 779 and 743. If said bias is above the breakdown voltage and if the MIS structure exhibits the appropriate passive quench circuit characteristics, the four pixels of the array will be operated as a monolithic SPAD array with common cathode connection 743 providing analog summation of the currents through all of the APD pixels of the array.

FIG. 26 illustrates details of pixels 762A and 762B of an APD array as discussed above. The lateral spacing between pixels is 781, which the lateral extent of the active area of the pixels is 782. Dimension 783 is the gap between pixels, while dimension 784 if the lateral extent of the "I" region of the MIS structure. Feature 778 is the gap that defines the lateral extent of the "I" region of the MIS structure.

Referring now to FIG. 27, while the present dimensions are determined by both device design constraints (pixel sizes, pixel densities) and device technologies (lithography), dimensions 781 will typically range from 5 microns to 100 microns, and metal width 780 and gap 784 will typically have dimensions of 0.1-5.0 microns. Finite element modeling or coplanar slotline theory can be used to estimate the capacitance per unit length, which will typically range from 0.1 to 1.0 fF/micron, so a 10 micron×10 micron pixel could achieve a bypass capacitance of 4-40 fF, which is sufficient for many passive quench circuit applications. Note that while the geometry shown in the drawings shows the MIS structure completely surrounding the pixels, alternative designs could consider MIS structure on only two sides of the structure or even on only one side of the structure.

FIG. 28 illustrates an embodiment of the layer structure used to form the virtual beveled edge mesa structure prior to implantation comprising semiconductor layers grown on an n+ GaAs substrate 800. Layer 801 of thickness 811 is a n-type GaAs buffer layer grown directly on top of substrate 800, and is used to initiate high quality epitaxial growth. Layer 801 includes a GaAs layer doped n-type to a doping density of $5\times10^{17}$ cm^3 and grown to a thickness 811 of 500 nm. Layer 802 consists of a Ga0.51In0.49P layer doped n-type to a doping density of $5\times10^{18}$ cm^3 and grown to a thickness 812 of 50 nm. Layer 803 includes a Ga0.51In0.49P layer doped n-type to a doping density of $1\times10^{18}$ cm^3 and grown to a thickness 813 of 100 nm. Layer 804 includes a not purposely doped Ga0.51In0.49P layer grown to a thickness 814 of 1000 nm. Layer 805 includes a Ga0.51In0.49P layer doped p-type to a doping density of $1\times10^{17}$ cm^3 and grown to a thickness 815 of 800 nm. Layer 806 includes a Ga0.51In0.49P layer where the doping is linearly graded from a p-type doping density of $5\times10^{17}$ cm^3 at the interface with layer 805 to a p-type to a doping density of $5\times10^{18}$ cm^3 at the interface with layer 807. The thickness 816 of layer 806 is 100 nm. Layer 806 is designed to approximately match the profile of implant damage, which typically exhibits a roughly Gaussian distribution, and therefore abrupt changes in doping may be difficult to accurately compensate without either over compensating or under compensating some of the layers of the device. Layer 807 includes a Ga0.51In0.49P layer doped p-type to a doping density of $5\times10^{18}$ cm^3 and grown to a thickness 817 of 30 nm. Layer 808 includes an Al0.52In0.48P layer doped p-type to a doping density of $5\times10^{18}$ cm^3 and grown to a thickness 818 of 30 nm. Layer 808 is designed as a window layer to passivate the underlying Ga0.51In0.49P layer 807 and to reduce surface recombination at the interface between layers 807 and 808, which enables improved performance for short optical wavelengths (i.e. blue wavelengths). Finally, layer 809 includes a GaAs contacting layer doped p-type to a doping density of $5\times10^{19}$ cm^3 and grown to a thickness 819 of 120 nm. The thickness 317 of layer 307 is chosen, in part, to both enable good ohmic contacts to be achieved as well as to provide a sacrificial layer for the isolation implant, which enables a He+ implant with an energy of 20 keV to be used with the peak of the ion implantation damage occurring in layers 807 and 808. Note that, like in the other described embodiments, all dimensions, thicknesses, doping concentrations and other particulars are merely illustrative. Those skilled in the art can choose other configurations best suiting a particular application at hand without loss of generality.

FIG. 29 illustrates a plot of depth versus density for the preceding structure. Axis 899 is density on a logarithmic scale, running from a minimum density of 1E14 per cm^3 to a maximum density of 1E19 per cm^3. Axis 898 represents a linear scale of the depth into the sample of FIG. 28, with the scale running from 0 to 1.50 microns in depth, where 0 represents the top surface of the structure in FIG. 28, which would be the air exposed side of layer 809, and the 1.5 micron depth is in the middle of undoped layer 804. The dashed line 852 represents the designed doping profile of the layer. The solid line 851 represents a calculation of the gallium vacancy density, which is calculated using the stopping range of ions in matter to simulate the effects of He+ ion implantation damage. The calculated gallium vacancy density is used to provide an estimate of the density of defects in the sample. Note that SRIM or similar software mentioned herein does not calculate the effects of crystalline structure channeling, so the resulting implantation damage most accurately represented implantation at an angle with respect to crystalline channeling directions.

An object is to provide as reasonable match between the intentional doping concentration (curve 852) and implant damage profile (curve 851), where reasonable match is defined as having an implant damage profile (gallium displacements) that are within about a factor of two of the doping concentration. We note here that the damage profile calculated using software such as SRIM are approximations based on the best available experimental and theoretical analysis. Furthermore, our approach uses gallium vacancies as a proxy for the density of defects caused by ion implantation damage, though it would be equally valid to use indium vacancies, phosphorous vacancies, total vacancies, total displacements, etc. Additionally, the SRIM program assumes that the implantation occurs at zero Kelvin, and in-situ annealing may occur for implants done at other temperatures. Finally, the SRIM program does not evaluate the effect of post implantation annealing, which is often used to reduce the defect damage and stabilize the implant isolation. The values of He+ ion energy and dose are shown in Table II. For formation of the virtual beveled edge geometry using a first ion implantation, we estimate that the actual He+ ion dose should be a factor of 1-10-fold higher than the values in Table II, followed by an first anneal to a temperature between 300° C. and 600° C. For formation of the isolation implant the He+ ion dose may be a factor of 5 fold to 25 fold higher than the values in Table II, followed by a second anneal to a temperature between 350° C. and 600° C.

Table II illustrates He+ ion energies and doses used to calculate the Ga vacancy concentration curve 851.

TABLE II

| He+ ion energy | Dose |
|---|---|
| 20 keV | 1.9E12/cm² |
| 70 keV | 0.2E11/cm² |
| 145 keV | 0.31E11/cm² |
| 270 keV | 0.54E11/cm² |

The present invention should not be considered limited to the particular embodiments described above, but rather should be understood to cover all aspects of the invention as fairly set out in the attached claims. Various modifications, equivalent processes, as well as numerous structures to which the present invention may be applicable, will be apparent to those skilled in the art to which the present invention is directed upon review of the present disclosure. The claims are intended to cover such modifications and equivalents

What is claimed is:

1. A semiconductor device, comprising:
a substrate layer;
a plurality of doped semiconductor layers including a first semiconductor layer doped with a first dopant disposed above said substrate and a second semiconductor layer doped with a second dopant disposed above said first semiconductor layer and proximal thereto;
a first depletion region in said first semiconductor layer proximal to said second semiconductor layer;
a second depletion region in said second semiconductor layer proximal to said first semiconductor layer;
said first and second semiconductor layers being ion implanted in selected regions thereof and having an ion implantation profile in each of said first and second semiconductor layers at a generally positive lateral profile angle with respect to a normal to said first and second semiconductor layers; and
said ion implantation profile further defining interior regions of said first and second semiconductor layers that are not ion implanted, and exterior regions of said first and second semiconductor layers that are ion implanted, said interior non-implanted region of the first semiconductor layer having a larger area than said interior non-implanted region of the second semiconductor layer.

2. The device of claim 1, said device having an electrical field between said first and second depletion regions wherein said electrical field is greater in a central portion of said interior region and lesser in portions near said ion implantation profile.

3. The device of claim 1, further comprising an electrical circuit coupled to said substrate and to any of said semiconductor layers so as to detect at least one incident photon in any of said semiconductor layers and to provide an electrical output corresponding to said detected one or more photons.

4. The device of claim 3, said electrical circuit comprising a passive quench circuit.

5. The device of claim 1, one of said first and second semiconductor layers having a p-type dopant and the other of said first and second semiconductor layers having a n-type dopant.

6. The device of claim 1, said ion implantation profile generally defining a mesa in said first and second semiconductor layers having upwardly and inwardly narrowing shape according to said ion implantation profile.

7. The device of claim 1, said ion implantation profile defining a boundary between said interior regions having relatively greater conductivities and said exterior regions having relatively lower conductivities as a result of said ion implantation.

8. The device of claim 6, said depletion regions being thinner near a central portion of said interior regions and thicker near said ion implantation profile.

9. The device of claim 1, said exterior regions forming an electrical isolation or guard region around said interior regions of the device.

10. The device of claim 1, a doping density in said second layer being less than a doping density in said first layer.

* * * * *